US005700622A

United States Patent [19]
Hirai et al.

[11] Patent Number: 5,700,622
[45] Date of Patent: Dec. 23, 1997

[54] PLATEMAKING PROCESS WITH HEAT DEVELOPABLE SILVER SALT DIFFUSION TRANSFER

[75] Inventors: Hiroyuki Hirai; Yuji Mihara, both of Kanagawa, Japan

[73] Assignee: Fuji Photo Film Co., Ltd., Kanagawa, Japan

[21] Appl. No.: 644,482

[22] Filed: May 10, 1996

[30] Foreign Application Priority Data

May 12, 1995 [JP] Japan .............................. HEI 7-137450
May 12, 1995 [JP] Japan .............................. HEI 7-137510

[51] Int. Cl.$^6$ .............................. G03C 8/40; G03C 8/52; G03F 7/07
[52] U.S. Cl. ......................... 430/203; 430/204; 430/206
[58] Field of Search ............................. 430/203, 204, 430/206

[56] References Cited

U.S. PATENT DOCUMENTS

| | | | |
|---|---|---|---|
| 3,220,837 | 11/1965 | Land et al. | 430/204 |
| 3,438,776 | 4/1969 | Yudelson | 430/203 |
| 3,490,905 | 1/1970 | Blake | 430/204 |
| 3,721,559 | 3/1973 | De Haes et al. | 430/204 |
| 4,639,407 | 1/1987 | Aono | 430/203 |
| 4,740,445 | 4/1988 | Hirai et al. | 430/203 |
| 4,876,171 | 10/1989 | Hirai | 430/203 |

FOREIGN PATENT DOCUMENTS 1583235 10/1969 France .
48-29723 9/1973 Japan .

*Primary Examiner*—Richard L. Schilling
*Attorney, Agent, or Firm*—Sughrue, Mion, Zinn, Macpeak & Seas, PLLC

[57] ABSTRACT

A process for simply and rapidly producing a lithographic printing plate is disclosed, which comprises image-wise exposing a silver halide photosensitive material comprising a substantially water-insoluble basic metal compound and optionally having a physical-development nucleus layer on the external surface thereof, superposing the silver halide photosensitive material either after or simultaneously with the image-wise exposure on an image-receiving material which contains a complex-forming compound and has a physical-development nucleus layer on the external surface thereof or on a sheet which contains a complex-forming compound, in such a manner that the coating side of the photosensitive material is in contact with the coating side of the image-receiving material or the sheet, heating the superposed materials in the presence of a reducing agent and water, and subsequently separating both materials from each other to form a silver image as an ink-receptive area on the physical-development nucleus layer by means of silver salt diffusion transfer. The printing plate of the present invention has improved impression capacity.

2 Claims, No Drawings

PLATEMAKING PROCESS WITH HEAT DEVELOPABLE SILVER SALT DIFFUSION TRANSFER

FIELD OF THE INVENTION

The present invention relates to a process for producing a lithographic printing plate based on silver salt diffusion transfer. More particularly, this invention relates to a platemaking process in which simple and rapid heat development is used to produce a lithographic printing plate. This invention also relates to a process for producing a lithographic printing plate having improved impression capacity.

BACKGROUND OF THE INVENTION

Printing plates in which a silver metal image formed by the silver salt diffusion transfer process (DTR process) is utilized as an ink-receptive area are known. Such printing plates are described in, e.g., JP-B-48-16725 (the term "JP-B" as used herein means an "examined Japanese patent publication"), JP-B-48-30562, JP-B-48-29723, JP-A-52-150105 (the term "JP-A" as used herein means an "unexamined published Japanese patent application"), JP-A-53-21602, JP-A-56-8145, JP-A-57-211148, and U.S. Pat. Nos. 3,220,837, 3,721,559, and 3,490,905.

However, the processes described in these references are not always satisfactory in handleability because an unstable developing solution is used and a prolonged development time is necessary. Improvements in these respects are desired.

Further, as described in JP-A-57-211148 and others, the lithographic printing plates produced using DTR are required to be improved in impression capacity, as in lithographic printing plates. It is known that the impression capacity of a silver image obtained by the DTR process is considerably influenced by the conditions under which the transferred silver grains were formed (the stability constant, diffusion rate, and reduction rate of the silver salt, coexistent substances, etc.), i.e., by the size, shape, and surface state of the developed silver grains obtained by the process.

It is therefore desired to provide a simple and rapid platemaking process, a lithographic printing plate having excellent impression capacity, and a process for producing the plate.

SUMMARY OF THE INVENTION

The first object of the present invention is to provide a process for simply and rapidly producing a lithographic printing plate without using a processing solution.

The second object of the present invention is to provide a lithographic printing plate having excellent impression capacity and a process for producing the same.

According to a first aspect of the present invention, there is provided a process for producing a lithographic printing plate which comprises image-wise exposing a silver halide photosensitive material comprising a support having thereon at least a photosensitive silver halide, a binder, and a substantially water-insoluble basic metal compound, superposing the silver halide photosensitive material either after or simultaneously with the image-wise exposure on an image-receiving material which contains a complex-forming compound capable of forming a complex with the metal ion contained in the basic metal compound and a silver halide solvent and has a physical-development nucleus layer on the external surface thereof, in such a manner that the coating side of the photosensitive material is in contact with the coating side of the image-receiving material, heating the superposed materials in the presence of a reducing agent and water, subsequently separating both materials from each other to form a silver image on the physical-development nucleus layer by means of silver salt diffusion transfer, and utilizing the silver image as an ink-receptive area.

According to a second aspect of the present invention, there is provided a process for producing a lithographic printing plate which comprises image-wise exposing a silver halide photosensitive material comprising a support having thereon at least a photosensitive silver halide, a binder, and a substantially water-insoluble basic metal compound and having a physical-development nucleus layer on the external surface thereof, superposing the silver halide photosensitive material either after or simultaneously with the image-wise exposure on a sheet which contains a complex-forming compound capable of forming a complex with the metal ion contained in the basic metal compound and a silver halide solvent, in such a manner that the coating side of the photosensitive material is in contact with the coating side of the sheet, heating the superposed materials in the presence of a reducing agent and water, subsequently separating the sheet from the photosensitive material to form a silver image on the physical-development nucleus layer by means of silver salt diffusion transfer, and utilizing the silver image as an ink-receptive area.

DETAILED DESCRIPTION OF THE INVENTION

The present invention is explained below in detail.

In the present invention, the substantially water-insoluble basic metal compound used in the photosensitive material, and the complex-forming compound capable of forming a complex with the metal ion contained in the basic metal compound and used in the image-receiving material of the first aspect of the present invention (hereinafter referred to as "the image-receiving material") or in the sheet of the second aspect of the present invention (hereinafter referred to as "the complexing agent sheet") are used as a base precursor. Namely, the two compounds undergo a complex-forming reaction in the presence of water and, as a result, release a base. Combinations of the substantially water-insoluble basic metal compound and the complex-forming compound are disclosed in, e.g., JP-A-62-129848, European Patent 210,660 A2, and U.S. Pat. No. 4,740,445.

Preferred examples of the substantially water-insoluble basic metal compound include the oxide, hydroxide, and basic carbonate of zinc or aluminum. Especially preferred of these are zinc oxide, zinc hydroxide, and basic zinc carbonate.

The substantially water-insoluble basic metal compound is used as fine particles dispersed in a hydrophilic binder, as described in, e.g., JP-A-59-174830. The average particle diameter of these fine particles is preferably from 0.001 to 5 µm, more preferably from 0.01 to 2 µm. The content thereof in the photosensitive material is preferably from 0.01 to 5 g/m$^2$, more preferably from 0.05 to 2 g/m$^2$.

The complex-forming compound used in the image-receiving material or the complexing agent sheet of the present invention is a compound known as a chelating agent in analytical chemistry and as a hard water softener in photographic chemistry. Details of this compound are given in the patent specifications mentioned above and *Saku-keisei Hannō* (*Complex-forming Reaction*), written by A. Ringbom, translated by Nobuyuki Tanaka and Haruko Sugi (Sangyo Tosho). The complex-forming compound for use in the present invention is preferably a water-soluble compound, and examples thereof include aminopolycarboxylic acids (and salts) such as ethylenediaminetetraacetic acid, nitrilotriacetic acid, and diethylenetriaminepentaacetic acid, aminophosphonic acids (salts) such as aminotris (methylenephosphonic acid) and ethylenediaminetetramethylenephosphonic acid, and pyridinecarboxylic acids (salts) such as 2-picolinic acid, pyridine-2,6-dicarboxylic acid, and 5-ethyl-2-picolinic acid. Especially preferred of these are pyridinecarboxylic acids (salts).

In the present invention, the complex-forming compound is preferably used in the form of a salt obtained by neutralizing the same with a base. Especially preferred salts include salts with organic bases, e.g., guanidine and derivatives thereof, amidines, and tetraalkylammonium hydroxides, and with alkali metals, e.g., sodium, potassium, and lithium. Preferred examples of the complex-forming compound are given in, e.g., JP-A-62-129848 and European Patent 210, 660 A2, both mentioned above. The content of the complex-forming compound in the image-receiving material or the complexing agent sheet is from 0.01 to 10 g/m², desirably from 0.05 to 5 g/m².

The image-receiving material of the first aspect or the photosensitive material of the second aspect in the present invention contains physical-development nuclei in the external surface layer thereof. In the first aspect of the present invention, the physical-development nuclei serve to reduce a soluble silver salt diffused from the photosensitive material into physically developed silver to fix the same, and in the second aspect of the present invention, the physical-development nuclei serve to reduce a soluble silver salt diffused from the silver halide emulsion layer into physically developed silver to fix the same. Any known physical-development nuclei can be used. Examples thereof include colloidal particles of a heavy metal such as zinc, mercury, lead, cadmium, iron, chromium, nickel, tin, cobalt, or copper, colloidal particles of a noble metal such as palladium, platinum, silver, or gold, and colloidal particles of a compound of any of these metals with a chalcogen, e.g., sulfur, selenium, or tellurium. These physical-development nucleus materials may be obtained by reducing the corresponding metal ions with a reducing agent such as, e.g., ascorbic acid or sodium boron hydride to prepare colloidal metal dispersions, or by mixing the same with a solution of a soluble sulfide, selenide, or telluride to prepare colloidal dispersions of water-insoluble metal sulfides, metal selenides, or metal tellurides. It is preferred to form these dispersions in a hydrophilic binder such as gelatin. Methods for preparing colloidal silver particles are described in, e.g., U.S. Pat. No. 2,688,601. If desired and necessary, the desalting known as a step in a silver halide emulsion preparation process may be conducted to remove the excess salt. The size of the physical-development nuclei is desirably from 0.0005 to 0.5 µm, preferably from 0.001 to 0.1 µm.

The amount of these physical-development nuclei contained is usually from $10^{-3}$ to 100 mg/m², desirably from $10^{-2}$ to 10 mg/m².

Although physical-development nuclei prepared beforehand may be added to a coating liquid, it is possible to produce the nuclei in a coating liquid containing a hydrophilic binder by, e.g., reacting silver nitrate with sodium sulfide or reacting gold chloride with a reducing agent, etc.

Preferred physical-development nucleus materials include silver, silver sulfide, and palladium sulfide.

The various hydrophilic polymers enumerated later can be used as the binder of the physical-development nucleus layer. In order for a transferred silver image to be exposed as much as possible, the use amount of the binder is desirably small. Specifically, the amount thereof is 100% by weight or smaller, desirably 50% by weight or smaller, based on the amount of the physical-development nuclei. The thickness of the physical-development nucleus layer is desirably about 1 µm or smaller, preferably 0.5 µm or smaller. The physical-development nucleus layer need not contain a binder; a binder-free nucleus layer may be formed on an emulsion layer by vacuum deposition, cathode sputtering, etc.

A known silver halide solvent can be used in the image-receiving material or the complexing agent sheet of the present invention. Examples thereof include thiosulfates such as sodium thiosulfate and ammonium thiosulfate; sulfites such as sodium sulfite; the organic thioether compounds given in JP-B-47-11386, such as 1,8-dihydroxy-3, 6-dithiaoctane, 2,2-thiodiethanol, and 6,9-dioxa-3,12-dithiatetradecane-1,14-diol; the compounds having a five- or six-membered imide ring as given in Japanese Patent Application No. 6-325350, such as uracil and hydantoin; and the compounds represented by the following general formula as described in JP-A-53-144319.

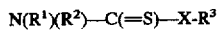

$$N(R^1)(R^2)\text{—}C(=S)\text{—}X\text{-}R^3$$

In the formula, X represents a sulfur atom or an oxygen atom. $R^1$ and $R^2$ may be the same or different, and each represents an aliphatic group, an aryl group, a heterocyclic group, or an amino group. $R^3$ represents an aliphatic group or an aryl group. $R^1$ and $R^2$ or $R^2$ and $R^3$ may be bonded to each other to form a five- or six-membered heterocycle.

Of the compounds enumerated above, the compounds having a five- or six-membered imide ring such as uracil and hydantoin are especially preferred in the present invention.

The content of the silver halide solvent in the image-receiving material or the complexing agent sheet is from 0.01 to 5 g/m², desirably from 0.05 to 2.5 g/m². The molar ratio of the silver halide solvent to the silver contained in the photosensitive material is from 1/20 to 20, desirably from 1/10 to 10. The silver halide solvent may be added to a coating liquid in the form of a solution in a solvent, e.g., water, methanol, ethanol, acetone, or DMF, or in an aqueous alkali solution or in the form of a finely particulate solid.

In the present invention, the image-receiving material or the complexing agent sheet may contain the polymer having repeating structural units derived from vinylimidazole and/ or vinylpyrrolidone as described in Japanese Patent Application No. 6-325350.

The photosensitive material for use in the present invention basically comprises a support having thereon a photosensitive silver halide, a hydrophilic binder, and a substantially water-insoluble basic metal compound, and in the second aspect of the present invention, the material further has a physical-development nucleus layer on the external surface thereof. If desired and necessary, ingredients such as, e.g., a reducing agent, an organic metal salt oxidizing agent, and an antihalation dye or pigment may be further incorporated.

Although these ingredients are incorporated into the same layer in most cases, they may be separately incorporated into two or more layers. Although the reducing agent is preferably incorporated in the photosensitive material beforehand, it may be externally fed to the photosensitive material, for example, by diffusing the same from the image-receiving material or the complexing agent sheet. The silver halide emulsion photosensitive layer may be composed of two or more layers according to need.

In the photosensitive material, various nonphotosensitive layers such as, e.g., a subbing layer, an interlayer, a filter layer, and an antihalation layer may be formed between the silver halide emulsion layers and as an upper or lower layer. On the back side of the support, various auxiliary layers such as, for example, a back layer may be formed. Further in the first aspect of the present invention, a protective layer may be provided in the photosensitive material. Specific examples of such optional layers include a subbing layer such as that described in U.S. Pat. No. 5,051,335, an interlayer containing a reducing agent and a DIR compound such as the interlayers described in JP-A-1-120553, JP-A-5-34884, and JP-A-2-64634, an interlayer containing an electron-transporting agent such as the interlayers described in U.S. Pat. Nos. 5,017,454 and 5,139,919 and JP-A-2-235044, a protective layer containing a reducing agent such as the protective layer described in JP-A-4-249245, and combinations of these layers.

In the case of using as a support a polyethylene-laminated paper containing a white pigment, e.g., titanium oxide, the support preferably has a back layer designed to have an antistatic function and a surface resistivity of $10^{12}$ Ω·cm or lower. Besides hydrophilic substances including gelatin, the polymer described in Japanese Patent Application No. 6-177183 can be used as a binder of the back layer.

Preferred photosensitive silver halides that can be used in the present invention are silver chloride, silver iodochloride, silver chlorobromide, and silver iodochlorobromide. In the first aspect of the present invention, especially preferred are silver halides having a silver chloride content of 80% by mole or higher, in particular 90% by mole or higher, and the silver iodide content thereof is preferably 2% by mole or lower, more preferably 1% by mole or lower, in particular 0.5% by mole or lower. In the second aspect of the present invention, especially preferred are silver halides having a silver chloride content of 50% by mole or higher, in particular 70% by mole or higher, and the silver iodide content thereof is preferably 5% by mole or lower, more preferably 2% by mole or lower.

The silver halide used in the present invention may be the surface latent image type or the internal latent image type. An internal latent image type emulsion in combination with a nucleating agent and a photo-fogging agent is used as a direct reversal emulsion. The silver halide for use in the present invention may have a multiple grain structure in which the inner part and the surface part have different halogen compositions. The silver halide may also comprise silver halide emulsions which have different compositions and have been united by means of epitaxial junction.

In the present invention, a silver halide emulsion having a high silver chloride content can be especially used in which each silver halide grain has a silver bromide-rich phase in a layer or non-layer form disposed inside and/or on the silver halide grain, as described above. The silver bromide-rich phase desirably has such a halogen composition that the silver bromide content thereof is at least 20% by mole, preferably higher than 30% by mole. The silver bromide content of a silver bromide-rich phase is determined by, e.g., the X-ray diffraction method. Techniques for applying the X-ray diffraction method to silver halides are described in, e.g., C. R. Berry, S. J. Marino, *Photographic Science and Technology*, Vol. 2, p. 149 (1955) and Vol. 4, p. 22 (1957). Although the silver bromide-rich phase in each grain may be present within the grain or on the edges, corners, or faces of the grain, preferred examples thereof include a silver bromide-rich phase epitaxially junctioned with grain corners.

The shape of the silver halide grains can be selected, according to purposes, from a normal crystal containing no twin plane, a singlet twinned crystal containing one twin plane, a parallel multiple twined crystal containing at least two parallel twin planes, a nonparallel multiple twined crystal containing at least two nonparallel twin planes, a sphere, a potato-like shape, a tabular shape with a high aspect ratio, and combinations of these. The shape of twinned crystal grains is described in *Shashin Kōgyō No Kiso (Fundamental Photographic Technology)*, "Gin-en Shashin Hen (a volume of Silver Halide Photography)", edited by Photographic Science and Technology Society of Japan, Corona Publishing Co., Ltd., p. 163.

Usable normal crystal grains include cubic grains bounded by (100) faces, octahedral grains bounded by (111) faces, and dodecahedral grains bounded by (110) faces. Dodecahedral grains are described in JP-B-55-42737 and JP-A-60-222842, and a report thereon is given in *Journal of Imaging Science*, Vol. 30, p. 247 (1986). Also usable according to purposes are (h11) face, (hh1) face, (hk0) face, or (hk1) face grains. Further, tetradecahedral grains having both (111) faces and (100) faces and grains having both (111) faces and (110) faces can be utilized. If desired and necessary, polyhedral grains such as, e.g., octatriacontahedral grains, 24-faced trapezohedral grains, hexatetracontahedral grains, or octahexacontahedral grains can be used.

Tabular grains having a high aspect ratio can also be preferably used. Tabular grains of a silver halide emulsion with a high silver chloride content bounded by (111) faces are described in, e.g., U.S. Pat. Nos. 4,399,215, 4,400,463, and 5,217,858 and JP-A-2-32. Tabular grains of a silver halide emulsion with a high silver chloride content bounded by (100) faces are described in, e.g., U.S. Pat. Nos. 4,946,772, 5,275,930, and 5,264,337, JP-A-6-59360 and JP-A-6-308648, and European Patent 0,534,395 A1. Such tabular grains having a high aspect ratio are advantageous in dye-enhanced sensitivity because they have a larger surface area than normal crystals having the same volume and are hence capable of adsorbing a larger amount of a sensitizing dye. The tabular grains have another advantage that they are highly active in development due to their large specific surface area.

The silver halide grains may have any average grain diameter ranging from 0.05 μm or smaller to a projected-area diameter exceeding 10 μm. The average grain diameter thereof is desirably from 0.1 to 2 μm, preferably from 0.1 to 0.9 μm.

The grain size distribution thereof is not particularly limited. For example, use may be made of a monodisperse silver halide emulsion in which at least 80% of all grains have a grain size within the range of ±30% of the number- or weight-average grain size, or a polydisperse emulsion having a wide grain size distribution may be used. However, a monodisperse emulsion is preferably used.

For the purpose of regulating gradation, two or more monodisperse silver halide emulsions which are substantially the same in color sensitivity but differ in grain size may be used in combination as described in JP-A-1-167743 and JP-A-4-223463. These emulsions may be incorporated into the same layer or into separate layers. Use may also be made of a combination of two or more polydisperse silver halide emulsions or a combination of a monodisperse emulsion and a polydisperse emulsion. Further, it is possible to use a combination of two or more monodisperse silver halide emulsions having different contents of a heavy metal as described later or a combination of two or more monodisperse silver halide emulsions which differ in chemical ripening.

A desalting step for removing excess salts is preferably conducted in a process for preparing the silver halide emulsion for use in the present invention. For this desalting, use may be made of the noodle-wash technique, in which the gelatin solution is caused to gel, or the precipitation (flocculation) method which utilizes an inorganic salt containing a polyvalent anion (e.g., sodium sulfate), an anionic surfactant, an anionic polymer (e.g., poly(sodium styrenesulfonate)), or a gelatin derivative (e.g., a gelatin into which aliphatic acyl, aromatic acyl, or aromatic carbamoyl groups have been incorporated). Alternatively, the ultrafilter shown in U.S. Pat. No. 4,758,505, JP-A-62-113137, JP-B-59-43727, or U.S. Pat. No. 4,334,012 may be used, or the natural sedimentation method or centrifugation method may be used. Usually, the sedimentation method is preferably used.

Methods for preparing silver halide emulsions are described in P. Glafkides, *Chimie et Physique Photographique*, Paul Montel (1967); G. F. Duffin, *Photographic Emulsion Chemistry*, Focal Press (1966); and V. L. Zelikman et al., *Making and Coating Photographic Emulsion*, Focal Press (1964).

For preparing a silver halide emulsion, any of the acid process, neutral process, and ammonia process may be used. For reacting a soluble silver salt with a soluble halogen salt, use can be made of the single-jet mixing method, the double-jet mixing method, and a combination of both. A method in which grains are formed in the presence of excess silver ions (the so-called reverse mixing method) can also be used. Further, it is possible to use one mode of the double-jet mixing method in which the pAg of the liquid layer where silver halide grains generate is kept constant, i.e., the so-called controlled double jet method. By these methods, a silver halide emulsion having a regular crystal system and an almost uniform grain size is obtained.

In the preparation of a silver halide emulsion, it is preferred to regulate the pAg and pH during grain formation. Descriptions of pAg and pH regulation are given in *Photographic Science and Engineering*, Vol. 6, pp. 159–165 (1962), *Journal of Photographic Science*, Vol. 12, pp. 242–251 (1964), U.S. Pat. No. 3,655,394, and British Patent 1,413,748.

A monodisperse silver halide emulsion having a narrower grain size distribution can be produced by using a silver halide solvent during the formation of silver halide grains. Examples of the silver halide solvent include thiocyanates (given in U.S. Pat. Nos. 2,222,264, 2,448,534, and 3,320,069), thioether compounds (given in U.S. Pat. Nos. 3,271,157, 3,574,628, 3,704,130, 4,297,439, and 4,276,347), thione compounds (given in JP-A-53-144319, JP-A-53-82408, and JP-A-55-77737), imidazole compounds (given in JP-A-54-100717), benzimidazole (given in JP-B-60-54662), and amine compounds (given in JP-A-54-100717). Ammonia can be used in combination with a silver halide solvent in such an amount as not to produce an adverse effect. Nitrogen-containing compounds such as those given in, e.g., JP-B-46-7781, JP-A-60-222842, and JP-A-60-122935 can be added at the stage of the formation of silver halide grains. Specific examples of the silver halide solvent are given in JP-A-62-215272, pages 12–18.

The formation or physical ripening of silver halide grains may be conducted in the presence of a metal salt (including a complex salt). Examples of the metal salt include salts or complex salts of noble or heavy metals such as iridium, rhodium, ruthenium, chromium, cadmium, zinc, lead, thallium, platinum, palladium, osmium, and rhenium. Preferred of these are salts or complex salts of iridium, rhodium, ruthenium, and chromium. These compounds may be used alone or in combination of two or more thereof. The addition amount thereof is about from $10^{-9}$ to $10^{-3}$ mol, preferably from $10^{-9}$ to $5\times10^{-6}$ mol, per mol of the silver halide. Preferred complex ions and coordination compounds include bromine ion, chlorine ion, cyano ion, nitrosyl ion, thionitrosyl ion, water, ammonia, and the like, and combinations of these. For example, yellow prussiate of potash, $K_2IrCl_6$, $K_3IrCl_6$, $(NH_4)_2RhCl_5(H_2O)$, $K_2RuCl_5(NO)$, $K_3Cr(CN)_6$, and the like are preferably used. Such a metal salt may be incorporated evenly throughout each silver halide grain, or may be incorporated into a local part of each grain, such as the grain surface, an inner part or silver bromide-rich phase of the grain, or a grain base with a high silver chloride content. The addition of these compounds can be accomplished by mixing a solution of any of the aforementioned metal salts with the aqueous halide solution during grain formation, by adding fine silver halide emulsion grains doped with ions of any of the aforementioned metals, or by directly adding a solution of any of the aforementioned metal salts during or after grain formation. Preferably used for enhancing sensitivity or density for high-intensity exposure are iridium, metal complex salts containing cyano ions as ligands such as yellow prussiate of potash, lead chloride, cadmium chloride, and zinc chloride. Preferably used in the case of spectral sensitization in the red or infrared region are metal complex salts containing cyano ions as ligands such as yellow prussiate of potash, lead chloride, cadmium chloride, and zinc chloride. Preferably used for high contract are iridium salts, rhodium salts, ruthenium salts, and chromium salts. For the purpose of imparting daylight handleability to the photosensitive material, a rhodium salt may be added in an amount of from $10^{-5}$ to $10^{-2}$ mol per mol of silver.

In forming silver halide grains by mixing a silver salt solution (e.g., aqueous $AgNO_3$ solution) with a halogen compound solution (e.g., aqueous KBr solution), the rate of grain formation may be heightened by increasing the rate of the addition of these solutions, increasing the addition amount thereof, or heightening the concentration thereof. Such techniques for accelerating the formation of silver halide grains are described in British Patent 1,335,925, U.S. Pat. Nos. 3,672,900, 3,650,757, and 4,242,445, JP-A-55-142329, JP-A-55-158124, JP-A-58-113927, JP-A-58-113928, JP-A-58-111934, and JP-A-58-111936.

During or after grain formation, halogen substitution (halogen conversion) may be conducted to form a sparingly soluble silver halide on the surface of the silver halide grains. This halogen conversion step is described in, e.g., *Die Grundlagen der Photographischen Prozesse mit Silverhalogeniden*, pp. 662–669 and *The Theory of Photographic Process*, 4th ed., pp. 97–98. In this method, a solution of a soluble halide may be added or fine silver halide grains may be added.

Although the silver halide emulsion of the present invention can be used in the chemically unsensitized state, it is usually used after chemical sensitization. Examples of chemical sensitization methods usable in the present invention include the chalcogen sensitization methods such as sulfur sensitization, selenium sensitization, and tellurium sensitization, the noble metal sensitization method using gold, platinum, palladium, etc., and the reduction sensitization method; these may be used alone or in combination thereof (see, for example, JP-A-3-110555 and JP-A-5-241267). These chemical sensitization methods may be carried out in the presence of a nitrogen-containing heterocyclic compound (JP-A-62-253159). An antifoggant, examples of which are shown later, may be added after completion of the chemical sensitization. Specifically, the methods described in JP-A-5-45833 and JP-A-62-40446 can be used.

An unstable sulfur compound is used as a sulfur sensitizer. For example, known sulfur compounds may be used, such as thiosulfates (e.g., hypo), thiourea derivatives (e.g., diphenylthiourea, triethylthiourea, and allylthiourea), allyl isothiocyanate, cystine, p-toluenethiosulfonates, rhodanine and derivatives thereof, and mercapto compounds. The sulfur sensitizer may be added in an amount sufficient to effectively enhance the sensitivity of the emulsion. Although the addition amount of the sulfur sensitizer varies depending on various factors, e.g., pH, temperature, other sensitizers, and the size of the silver halide grains, a preferred range thereof may be from $10^{-9}$ to $10^{-1}$ mol per mol of the silver halide.

In selenium sensitization, a known unstable selenium compound is used. Examples thereof include colloidal selenium metal, selenourea compounds (e.g., N,N-dimethylselenourea and N,N-diethylselenourea), selenoketones, selenoamides, aliphatic isoselenocyanates (e.g., allyl isoselenocyanate), selenocarboxylic acids and esters thereof, selenophosphates, diethyl selenide and derivatives thereof, and diethyl diselenide and derivatives thereof. Although the addition amount thereof varies depending on various factors like the sulfur sensitizer, a preferred range thereof may be from $10^{-10}$ to $10^{-1}$ mol per mol of the silver halide.

In addition to the chalcogen sensitization described above, sensitization with a noble metal can be conducted in the present invention. For gold sensitization, gold having a valence of either +1 or +3 may be used, and many kinds of gold compounds are usable. Representative examples thereof include chloroauric acid and the like, potassium chloroaurate, auric trichloride, potassium aurithiocyanate, potassium iodoaurate, tetraauric acid, ammonium aurothiacyanate, pyridyl trichlorogold, gold sulfide, gold selenide, and gold telluride.

Although the addition amount of the gold sensitizer varies depending on various factors, a preferred range thereof may be from $10^{-10}$ to $10^{-1}$ mol per mol of the silver halide.

The gold sensitizer may be added simultaneously with sulfur sensitization or with selenium or tellurium sensitization. Alternatively, the gold sensitizer may be added during, before, or after the step of sulfur, selenium, or tellurium sensitization. It is also possible to use the gold sensitizer alone.

The emulsion to be subjected to sulfur, selenium, tellurium, or gold sensitization in the present invention is not particularly limited in the pAg or pH thereof. However, the emulsion to be sensitized desirably has a pAg of from 5 to 11, preferably from 6.8 to 9.0, and a pH of from 3 to 10, preferably from 5.5 to 8.5.

Noble metals other than gold can also be used as a chemical sensitizer in the present invention. Examples of other noble metals include platinum, palladium, iridium, and rhodium. Salts or complex salts of these metals are also usable as sensitizers.

Reduction sensitization can be further conducted in the present invention. Examples of the reducing sensitizer for use in the present invention include known compounds such as ascorbic acid, stannous salts, amines and polyamines, hydrazine derivatives, formamidinesulfinic acid, silane compounds, and borane compounds. In the present invention, one selected from those known compounds can be used, or a combination of two or more thereof can be used. Preferred reducing sensitizers are stannous chloride, thiourea dioxide, dimethylaminoborane, L-ascorbic acid, and aminoiminomethanesulfinic acid. Although the addition amount of the reducing sensitizer should be suitably selected according to the condition of the emulsion, the appropriate range thereof is from $10^{-9}$ to $10^{-2}$ mol per mol of the silver halide.

Besides the above-described method in which a reducing sensitizer is added, use may be made of the method called silver ripening in which the emulsion is allowed to grow or ripen in a low-pAg atmosphere having a pAg of from 1 to 7, the method called high-pH ripening in which the emulsion is allowed to grow or ripen in a high-pH atmosphere having a pH of from 8 to 11, or a method in which reduction sensitization is conducted by passing hydrogen gas or with nascent hydrogen produced electrolytically. Two or more of these methods can be used in combination.

Although the reduction sensitization described above can be used as the only sensitization treatment, it can also be used in combination with the chalcogen sensitization or noble metal sensitization described hereinabove.

The amount of the silver halide emulsion contained in the photosensitive material in the present invention is desirably from 0.5 to 2.5 g/m$^2$, preferably from 0.8 to 2.0 g/m$^2$, in terms of silver amount.

Gelatin is preferably used as a protective colloid for emulsion preparation. However, other hydrophilic binders are also usable. A hydrophilic binder may be used either alone or in combination with gelatin. Preferred examples of the hydrophilic binders include proteins such as gelatin derivatives, graft polymers of gelatin with other polymers, albumin, and casein; cellulose derivatives such as hydroxyethyl cellulose and cellulose sulfate; sodium alginate, starch derivatives, polysaccharides, and carrageenan; and synthetic hydrophilic homo- or copolymers such as poly(vinyl alcohol), poly(vinyl alcohol) partially modified by alkyl group (i.e., alkyl-modified PVA), poly(vinyl-N-pyrrolidone), poly(acrylic acid), poly(methacrylic acid), polyacrylamide, polyvinylimidazole, and polyvinylpyrazole. The thioether polymer described in U.S. Pat. No. 3,615,624 can also be advantageously used.

The gelatin may be limed gelatin, an acid-treated gelatin, or delimed gelatin, or may be a gelatin derivative such as phthalated gelatin or low-molecular gelatin. Also usable is a gelatin oxidized with an oxidizing agent such as hydrogen peroxide or a gelatin treated with an enzyme. A hydrolyzate or enzymatic decomposition product of gelatin can also be used.

For the purpose of imparting green sensitivity, red sensitivity, or infrared sensitivity to the silver halide for use in the present invention, the photosensitive silver halide emulsion may be spectrally sensitized with a methine dye or another spectral sensitizer. If desired and necessary, a blue-sensitive emulsion may be spectrally sensitized to enhance the sensitivity in the blue region.

Especially for use in laser exposure in an image setter, color scanner, or the like, it is necessary to conduct spectral sensitization suitable for the wavelength of the particular laser.

Examples of usable dyes include cyanine dyes, merocyanine dyes, composite cyanine dyes, composite merocyanine dyes, holopolar cyanine dyes, hemicyanine dyes, styryl dyes, and hemioxonol dyes. Particularly useful are cyanine dyes, merocyanine dyes, and composite merocyanine dyes. Any of the basic heterocyclic nuclei ordinarily used in cyanine dyes can be applied to those dyes. Examples of such basic heterocyclic nuclei include the pyrroline nucleus, oxazoline nucleus, thiazoline nucleus, pyrrole nucleus, oxazole nucleus, thiazole nucleus, selenazole nucleus, imidazole nucleus, tetrazole nucleus, and pyridine nucleus; nuclei formed by fusing an alicyclic hydrocarbon ring to these nuclei; and the benzindolenine nucleus, indole nucleus, benzoxazole nucleus, naphthoxazole nucleus, benzothiazole nucleus, naphthothiazole nucleus, benzoselenazole nucleus, benzimidazole nucleus, and quinoline nucleus. These nuclei may have one or more substituents each bonded to a carbon atom.

A nucleus having a ketomethylene structure can be applied to merocyanine dyes or composite merocyanine dyes. Examples of the nucleus include five- or six-membered heterocyclic nuclei such as the pyrazolin-5-one nucleus, thiohydantoin nucleus, 2-thiooxazolidine-2,4-dione nucleus, thiazolidine-2,4-dione nucleus, rhodanine nucleus, and thiobarbituric acid nucleus.

Specific examples of the sensitizing dyes are given in, e.g., U.S. Pat. No. 4,617,257, JP-A-59-180550, JP-A-64-13546, JP-A-5-45828, and JP-A-5-45834.

These sensitizing dyes may be used either alone or in combination thereof. A combination of sensitizing dyes is often used especially for the purpose of supersensitization or wavelength regulation in spectral sensitization.

The emulsion may contain, besides a sensitizing dye, either a dye which itself does not function as a spectral sensitizer but shows a supersensitization effect or a compound which absorbs substantially no visible light but shows a supersensitization effect (e.g., the dyes or compounds given in U.S. Pat. No. 3,615,641, JP-A-59-192242, JP-A-59-191032, and JP-A-63-23145). In particular, the dyes or compounds given in JP-A-59-191032 and JP-A-59-192242 are preferably used in the case where a sensitizing dye showing spectral sensitization in the red to infrared region is used.

The time when a dye is added to an emulsion may be at any stage during emulsion preparation. The most common dye addition time is during the period of from completion of chemical sensitization to before coating. However, it is possible to add a sensitizing dye simultaneously with a chemical sensitizer to simultaneously conduct spectral sensitization and chemical sensitization as described in U.S. Pat. Nos. 3,628,969 and 4,225,666, or to conduct spectral sensitization prior to chemical sensitization as described in JP-A-58-113928 and JP-A-4-63337. It is also possible to add a sensitizing dye to initiate spectral sensitization prior to completion of the precipitation of silver halide grains. Further, use can be made of a method in which any of the aforementioned compounds is added in portions, i.e., part thereof is added prior to chemical sensitization and the remainder is added after the chemical sensitization, as shown in U.S. Pat. No. 4,225,666. To sum up, a sensitizing dye may be added at any stage during the formation of silver halide grains, and any of various addition methods including the method shown in U.S. Pat. No. 4,183,756 may be used.

The addition amount thereof may be from $9 \times 10^{-9}$ to $9 \times 10^{-3}$ mol per mol of the silver halide.

These sensitizing dyes and supersensitizers may be added in the form of a solution in a hydrophilic organic solvent such as methanol, an aqueous solution (which may be alkaline or acidic for enhancing solubility), a dispersion in gelatin or another substance, or a solution in a surfactant.

In order to enhance the adsorption of a sensitizing dye, any of soluble Ca compounds, soluble Br compounds, soluble I compounds, soluble Cl compounds, and soluble SCN compounds may be added before or after the addition of the sensitizing dye or during the addition thereof. Two or more of these compounds may be used in combination.

Preferred are $CaCl_2$, KI, KCl, KBr, and KSCN. Those may also be used in the form of fine grains of silver bromide, silver chlorobromide, silver iodobromide, or silver iodide or emulsion grains of silver rhodanide.

The photographic sensitive material to which the emulsion of the present invention is applied is not particularly limited in other additives. With respect to other additives, reference may be made to, e.g., *Research Disclosure*, Vol. 176, item 17643 (RD-17643), Vol. 187, item 18716 (RD-18716), and Vol. 307, item 307105 (RD-307105).

Additives for use in such steps and known photographic additives usable in the photosensitive material, the image-receiving material or the complexing agent sheet of the present invention are listed below together with the related parts of RD-17643, RD-18716, and RD-307105.

| Kind of Additive | RD-17643 | RD-18716 | RD-307105 |
|---|---|---|---|
| 1. Chemical sensitizer | p. 23 | p. 648 right column | p. 866 |
| 2. Sensitizer | | p. 648 right column | |
| 3. Spectral sensitizer, Supersensitizer | p. 23–24 | from p. 648 right column to p. 649 right column | pp. 866–868 |
| 4. Brightener | p. 24 | from p. 648 right column | p. 868 |
| 5. Antifoggant, Stabilizer | pp. 24–25 | from p. 649 right column | pp. 868–870 |
| 6. Light absorber, Filter dye, Infrared absorber | pp. 25–26 | from p. 649 right column to p. 650 left column | p. 873 |
| 7. Antistain agent | p. 25 right column | p. 650 from left to right column | |
| 8. Hardener | p. 26 | p. 651 left column | pp. 874–875 |
| 9. Binder | p. 26 | p. 651 left column | pp. 873–874 |
| 10. Plasticizer, Lubricant | p. 27 | p. 650 right column | p. 876 |
| 11. Coating aid, Surfactant | pp. 26–27 | p. 650 right column | pp. 875–876 |
| 12. Antistatic agent | p. 27 | p. 650 right column | pp. 876–877 |
| 13. Matting agent | | | pp. 878–879 |

The compounds, etc. shown below are also usable.

| Item | Related Parts |
|---|---|
| 1) Silver halide emulsion and production thereof | JP-A-2-97937, from page 20, right lower column, line 12 to page 21, left lower column, line 14; JP-A-2-12236, from page 7, right upper column, line 19 to page 8, left lower column, line 12; and JP-A-4-330430 and JP-A-5-11389. |
| 2) Spectral sensitizer dye | The spectral sensitizer dyes given in JP-A-2-55349, from page 7, left upper column, line 8 to page 8, right lower column, line 8; JP-A-2-39042, from page 7, right lower column, line 8 to page 13, right lower column, line 5; JP-A-2-12236, page 8, from left lower column, line 13 to right lower column, line 4; JP-A-2-103536, from page 16, right lower column, line 3 to page 17, left lower column, line 20; JP-A-1-112235; JP-A-2-124560; JP-A-3-7928; and JP-A-5-11389. |
| 3) Surfactant, Antistatic agent | JP-A-2-18542, from page 2, left lower column, line 13 to page 4, right lower column, line 18. |
| 4) Antifoggant, Stabilizer | JP-A-2-103536, from page 17, right lower |

| Item | Related Parts |
|---|---|
| | column, line 19 to page 18, right upper column, line 4, and page 18, right lower column, lines 1 to 5; and the thiosulfinic acid compounds given in JP-A-1-237538. |
| 5) Polymer latex | JP-A-2-103536, page 18, left lower column, lines 12–20. |
| 6) Compound having acid group | JP-A-2-103536, from page 18, right lower column, line 6 to page 19, left upper column, line 1; and JP-A-2-55349, from page 8, right lower column, line 13 to page 11, left upper column, line 8. |
| 7) Polyhydroxybenzene | JP-A-2-55349, page 11, from left upper column, line 9 to right lower column, line 17. |
| 8) Matting agent, Slip agent, Plasticizer | JP-A-2-103536, page 19, from left upper column, line 15 to right upper column, line 15. |
| 9) Hardener | JP-A-2-103536, page 18, right upper column, lines 5–17. |
| 10) Dye | JP-A-2-103536, page 17, right lower column, lines 1–18; and JP-A-2-39042, from page 4, right upper column, line 1 to page 6, right upper column, line 5. |
| 11) Binder | JP-A-2-18542, page 3, right lower column lines 1–20. |
| 12) Developing solution and method | JP-A-2-55349, from page 13, right lower column, line 1 to page 16, left upper column, line 10; and JP-A-2-103536, from page 19, right upper column, line 16 to page 21, left upper column, line 8. |
| 13) Black dot inhibitor | Compounds given in U.S. Pat. No. 4,956,257 and JP-A-1-118832. |
| 14) Redox compound | Compounds represented by the general formula (I) given in JP-A-2-301743 (in particular compounds 1 to 50); the general formulae (R-1), (R-2), and (R-3) and compounds 1 to 75 given in JP-A-3-174143, pages 3–20; and compounds given in JP-A-5-257239 and JP-A-4-283742. |
| 15) Monomethine compound | Compounds represented by the general formula (II) given in JP-A-2-287532 (in particular compounds II-1 to II-26). |
| 16) Hydrazine nucleating agent | JP-A-2-12236, from page 2, right upper column, line 19 to page 7, right upper column, line 3; and the general formula (II) and compounds II-1 to II-54 given in JP-A-3-174143, from page 20, right lower column, line 1 to page 27, right upper column, line 20. |
| 17) Nucleation accelerator | The general formulae (II-m) to (II-p) and compounds II-1 to II-22 given in JP-A-2-103536, from page 9, right upper column, line 13 to page 16, left upper column, line 10; and compounds given in JP-A-1-179939. |

Of the additives mentioned above, preferred examples of the antifoggant and stabilizer include azoles (e.g., benzothiazolium salts, nitroimidazoles, nitrobenzimidazoles, chlorobenzimidazoles, bromobenzimidazoles, nitroindazoles, benzotriazoles, and aminotriazoles); mercapto compounds {e.g., mercaptothiazoles, mercaptobenzothiazoles, mercaptobenzimidazoles, mercaptothiadiazoles, mercaptotetrazoles (in particular 1-phenyl-5-mercaptotetrazole and derivatives thereof), mercaptopyrimidines, and mercaptotriazines}; thioketo compounds such as, e.g., oxazolinethione; azaindenes {e.g., triazaindenes, tetrazaindenes (in particular 4-hydroxy-6-methyl(1,3,3a,7)tetrazaindene), and pentazaindenes}; benzenethiosulfonic acids; benzenesulfinic acid; and benzenesulfonamide.

In the present invention, the silver halide grains present in an unexposed area react with the silver halide solvent to change into a soluble silver complex salt, which is reduced on physical-development nuclei to deposit on the surface thereof as silver metal. This silver image area is a lipophilic area having a well regulated balance with the hydrophilicity of the nonimage area, giving a printing plate. In order for the thus-obtained lithographic printing plate to show further sufficient impression capacity on an offset printing machine, the image area only should receive a printing ink always in a constant amount and the nonimage area should not be soiled with the ink. The present inventors have found that an effective means for enhancing the ink-receptive ability of the lipophilic silver image area through a selective reaction therewith is to contact the image area with a liquid containing an organic compound having an —SH or >C=S group prior to printing. Thus, the image area can have enhanced lipophilicity to attain improved impression capacity.

Although there are a wide variety of organic compounds having an —SH or >C=S group which are especially useful in the present invention, particularly preferred compounds are represented by the following general formulae (A) and (B) (hereinafter these compounds being referred to as "compounds of the present invention").

General formula (A)

$$R_0\text{—S-M}$$

In general formula (A), $R_0$ represents an aliphatic hydrocarbon group, an aromatic hydrocarbon group, or a heterocyclic group, which each may have one or more substituents. From the standpoint of obtaining enhanced hydrophobicity, the total number of the carbon atoms contained in the compound is 6 or larger, desirably 8 or larger. M represents a hydrogen atom or an alkali metal atom.

General formula (B)

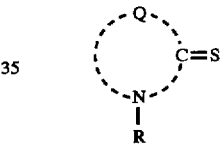

In general formula (B), R represents a hydrogen atom, an alkyl group having up to 20 carbon atoms, or a substituted or unsubstituted aryl or aralkyl group, and Q represents a group of atoms necessary for forming a five- or six-membered heterocycle in cooperation with the N and C atoms.

Examples of the five- or six-membered heterocycle include imidazole, imidazoline, thiazole, thiazoline, oxazole, oxazoline, pyrazoline, triazole, thiadiazole, thiazolidine, oxadiazole, tetrazole, pyridine, pyrimidine, pyridazine, pyrazine, and triazine. These rings each may be part of a fused ring comprising two or more constituent rings, or may have been condensed with an optionally substituted benzene or naphthalene ring.

Preferred of the compounds represented by general formula (A) are compounds represented by the following general formula (A-1) or (A-2).

General formula (A-1)

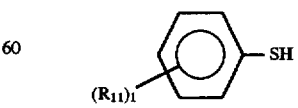

In general formula (A-1), $R_{11}$ represents a hydrogen atom, an alkyl group, a cycloalkyl group, an aralkyl group, an alkenyl group, or an aryl group, which each may have one or more substituents. Examples of the substituents which may be contained in $R_{11}$ include alkyl, aryl, cycloalkyl, aralkyl, alkoxy, aryloxy, alkylthio, arylthio, acyl, alkoxycarbonyl, amino, N-substituted amino, acylamino, carbamoyl, N-substituted carbamoyl, alkylsulfonyl, arylsulfonyl, alkylsulfonylamino, arylsulfonylamino, sulfamoyl, N-substituted sulfamoyl, cyano, hydroxy, and nitro groups and halogen atoms.

Preferred of these substituents are alkyl, alkoxy, aryloxy, alkoxycarbonyl, acylamino, and sulfonylamino groups and halogen atoms.

Symbol 1 represents an integer of 1 to 5. When 1 is 2 or larger, the $R_{11}$'s may be the same or different.

General formula (A-2)

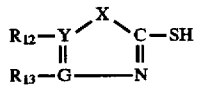

In general formula (A-2), X represents an oxygen atom, a sulfur atom, or >N—R' (where R' represents a hydrogen atom, an alkyl group, an alkenyl group, an amino group, an acylamino group, a sulfonamide group, or a substituted or unsubstituted aryl or aralkyl group); Y and G each represents a carbon atom or a nitrogen atom; and $R_{12}$ and $R_{13}$ each represents a hydrogen atom, an alkyl group, a substituted or unsubstituted aryl or aralkyl group, —SR", or —NH$_2$ (where R" represents a hydrogen atom, an alkyl group, an aryl group, an aralkyl group, a group derived from either an alkylcarboxylic acid or an alkali metal salt thereof, or a group derived from either an alkylsulfonic acid or an alkali metal salt thereof), provided that when Y and G each is a carbon atom, $R_{12}$ and $R_{13}$ may form a substituted or unsubstituted aromatic carbon ring or nitrogen-containing heterocyclic ring.

Especially preferred of the compounds represented by general formula (A-2) are compounds represented by the following general formulae (A-2a) to (A-2c).

General formula (A-2a)

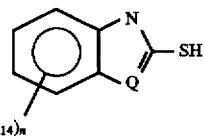

General formula (A-2b)

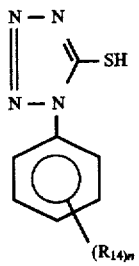

General formula (A-2c)

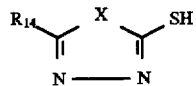

In the above formulae, n represents an integer of 1 or 2, and $R_{14}$ represents the same substituent as $R_{11}$. When n is 2, the $R_{14}$'s may be the same or different.

Specific examples of the organic compound having an —SH or >C=S group which are preferably used in the present invention are shown below. However, that organic compound should not be construed as being limited thereto.

$C_{12}H_{25}SH$    (1)

$C_{15}H_{31}SH$    (2)

(3)

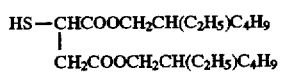
(4)

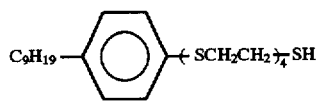
(5)

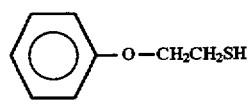
(6)

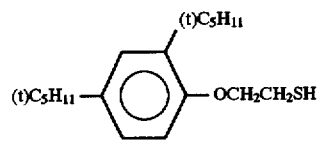
(7)

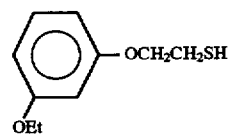

-continued
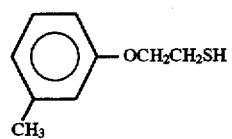
(8)
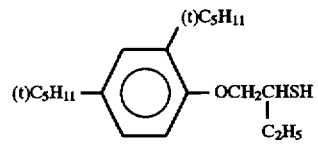
(9)
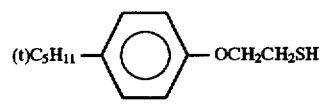
(10)
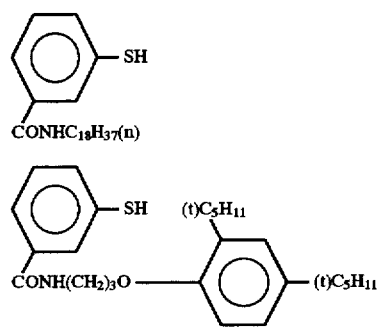
(11)
(12)
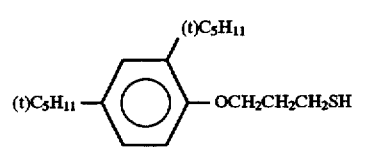
(13)
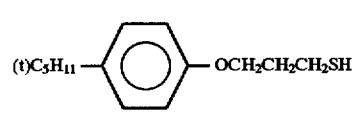
(14)
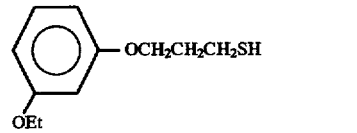
(15)
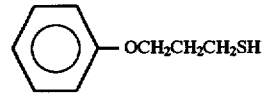
(16)
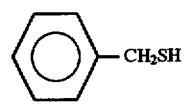
(17)
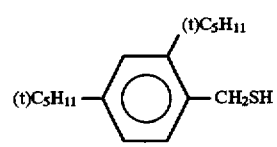
(18)
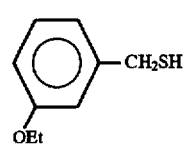
(19)

-continued
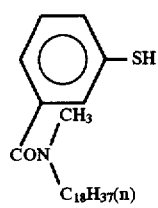 (20)
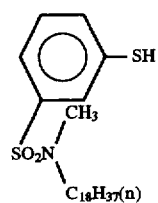 (21)
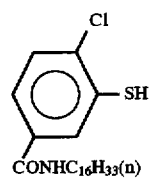 (22)
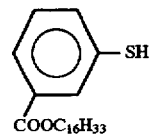 (23)
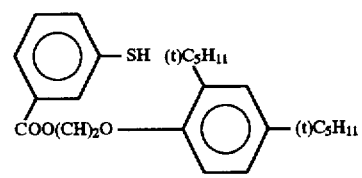 (24)
 (25)
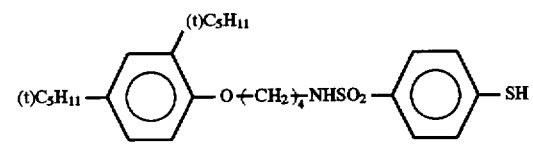 (26)
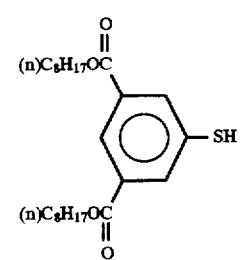 (27)
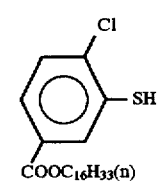 (28)

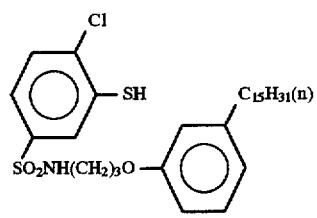
(29)
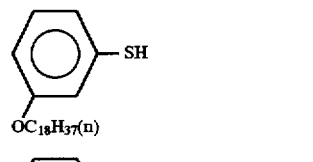
(30)
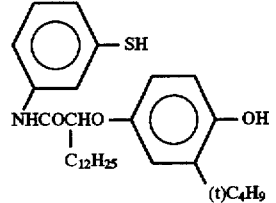
(31)
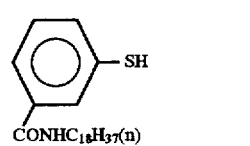
(32)
(33)
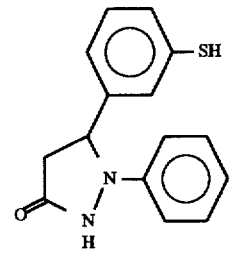
(34)
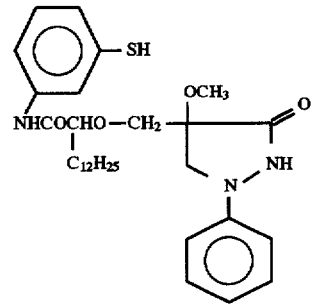
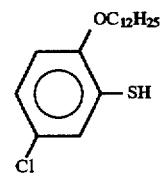
(35)
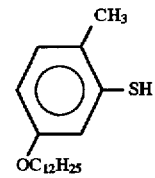
(36)

-continued
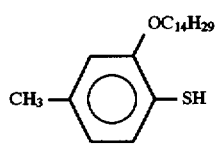
(37)
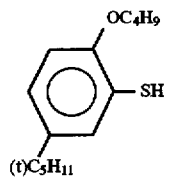
(38)
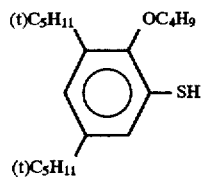
(39)
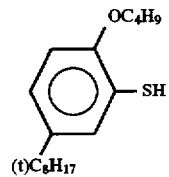
(40)
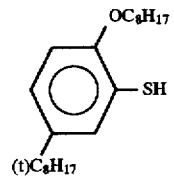
(41)
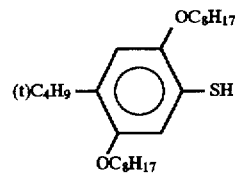
(42)
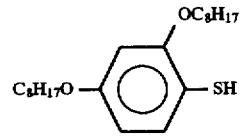
(43)
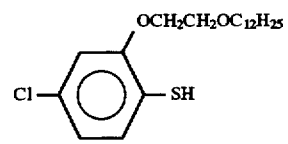
(44)
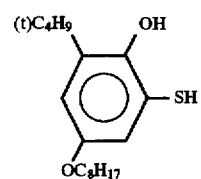
(45)

-continued
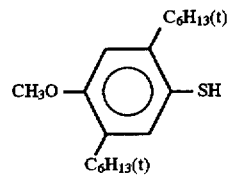
(46)
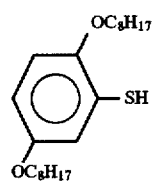
(47)
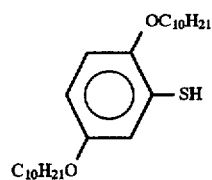
(48)
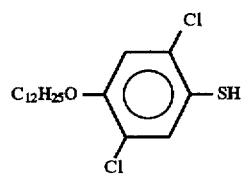
(49)
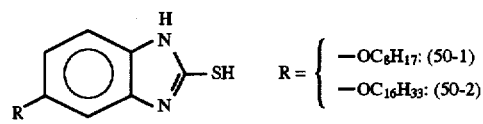
R = { —OC$_8$H$_{17}$: (50-1)
      —OC$_{16}$H$_{33}$: (50-2) }
(50)
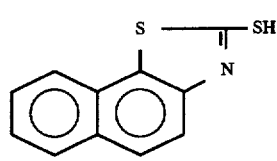
(51)
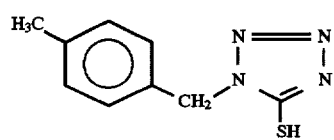
(52)
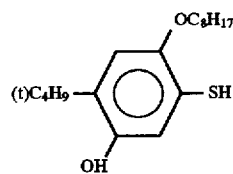
(53)
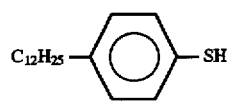
(54)
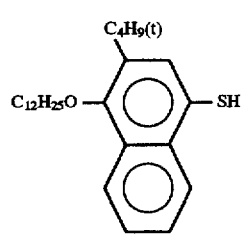
(55)

-continued
(56)
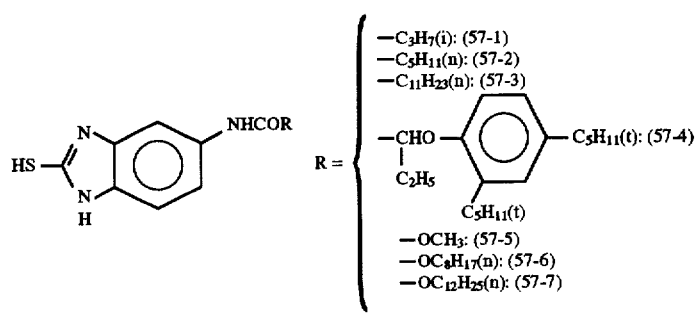
R = {
—C₃H₇(i): (57-1)
—C₅H₁₁(n): (57-2)
—C₁₁H₂₃(n): (57-3)
—CHO with C₂H₅, phenyl-C₅H₁₁(t), C₅H₁₁(t): (57-4)
—OCH₃: (57-5)
—OC₈H₁₇(n): (57-6)
—OC₁₂H₂₅(n): (57-7)
}
(57)
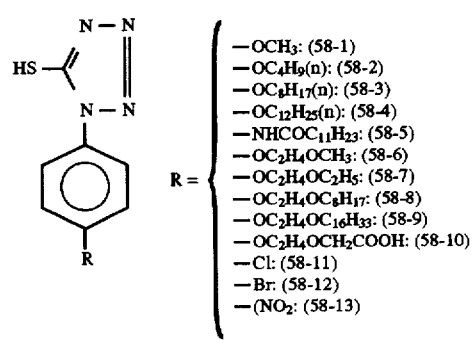
R = {
—OCH₃: (58-1)
—OC₄H₉(n): (58-2)
—OC₈H₁₇(n): (58-3)
—OC₁₂H₂₅(n): (58-4)
—NHCOC₁₁H₂₃: (58-5)
—OC₂H₄OCH₃: (58-6)
—OC₂H₄OC₂H₅: (58-7)
—OC₂H₄OC₈H₁₇: (58-8)
—OC₂H₄OC₁₆H₃₃: (58-9)
—OC₂H₄OCH₂COOH: (58-10)
—Cl: (58-11)
—Br: (58-12)
—(NO₂): (58-13)
}
(58)
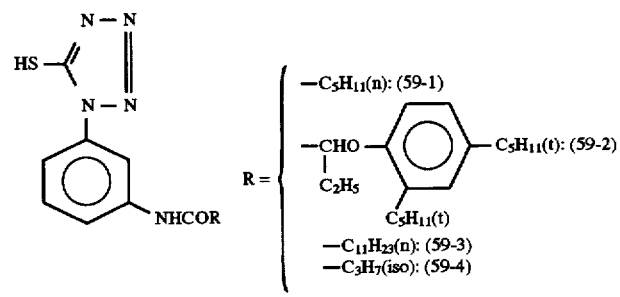
R = {
—C₅H₁₁(n): (59-1)
—CHO with C₂H₅, phenyl-C₅H₁₁(t), C₅H₁₁(t): (59-2)
—C₁₁H₂₃(n): (59-3)
—C₃H₇(iso): (59-4)
}
(59)
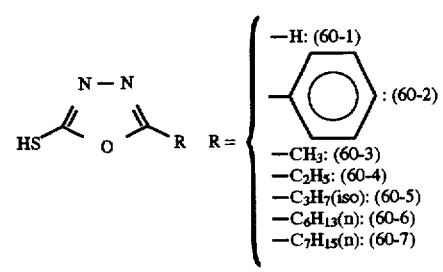
R = {
—H: (60-1)
—phenyl: (60-2)
—CH₃: (60-3)
—C₂H₅: (60-4)
—C₃H₇(iso): (60-5)
—C₆H₁₃(n): (60-6)
—C₇H₁₅(n): (60-7)
}
(60)

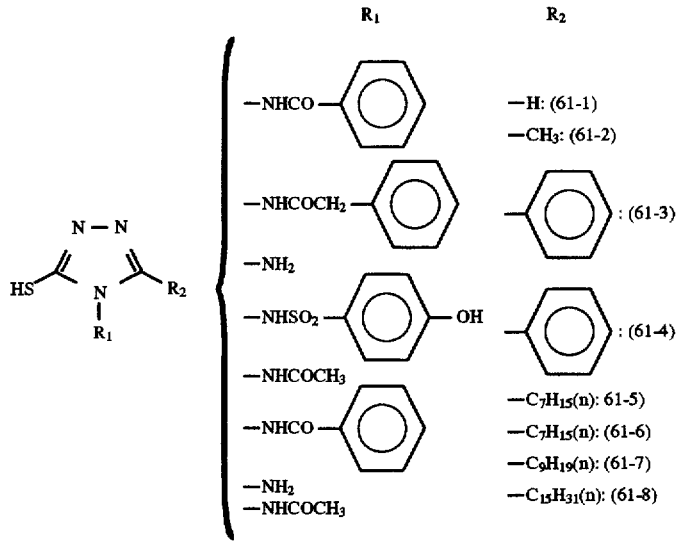
(61)
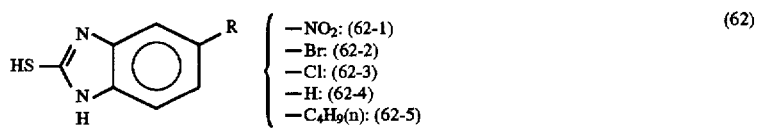
(62)
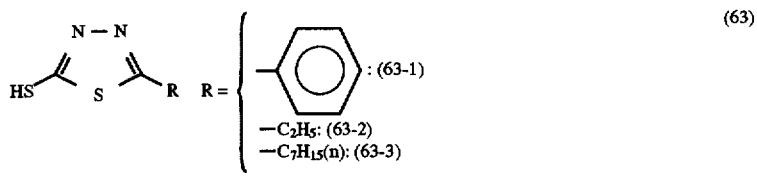
(63)
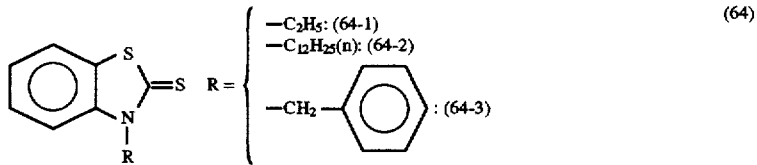
(64)
(65)
(66)
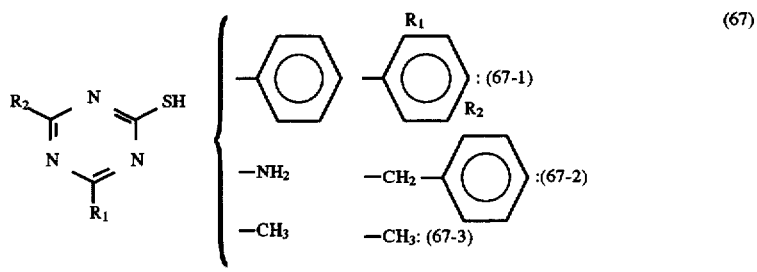
(67)

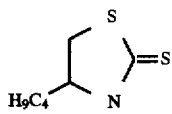

(68)

The use amount of the compounds of the present invention which is effective in accomplishing the objects of the present invention is not always the same, and can vary for each compound. However, the range of the concentration thereof is about from 0.01 to 10 g/l, desirably about from 0.05 to 5 g/l. The compounds of the present invention may be used alone or in combination of two or more thereof. Although a buffered aqueous solution with a pH of from 4 to 9 is preferably used as a solvent, a water-miscible organic solvent may be used in combination with the aqueous solution for the purpose of increasing the solubility of the compounds of the present invention. Examples of the organic solvent include acetone, methanol, ethanol, propanol, isopropanol, ethylene glycol, glycerol, tetrahydrofuran, dimethylformamide, dimethyl sulfoxide, and methyl ethyl ketone. Such organic solvents may be mixed with water in any desired proportion.

If desired and necessary, any of the aforementioned silver halide solvents may be added to the above-described solution containing a compound of the present invention (the solution being called a lipophilizing solution). By the addition of the silver halide solvents, the non-dissolved silver halide remaining in the photosensitive layer during the heat developable silver salt diffusion transfer oxidatively dissolves and reacts with the compound of the present invention contained in the lipophilizing solution to yield a sparingly soluble silver compound. Thus, a dense lipophilic layer is formed. This lipophilic layer is thought to bring about improved impression capacity. The lipophilizing solution may contain an oxidizing agent for silver grains, such as, e.g., a ferricyanide iron(III) salt or a water-soluble copper(II) salt.

The lipophilizing solution for use in the present invention is preferably buffered so that its pH is in the range of from 4 to 9. The reasons for this are as follows. A strong alkali reacts with free fatty acids present in a printing ink to yield soaps, which cause ink-water emulsification during printing. On the other hand, too low a pH is undesirable in that the compound of the present invention used for lipophilization has reduced solubility, or that machine corrosion is accelerated. Preferred buffering substances for use in regulating the pH of the solution include organic acids such as acetic acid, citric acid, and tartaric acid and inorganic acids such as phosphoric acid, sulfurous acid, and boric acid. The printing plate thus treated can be stored, after drying, over a prolonged period of time.

The lipophilizing solution for use in the present invention can also be applied, for example, after the heat developable silver salt diffusion transfer and after treated with an acid stop bath such as that ordinarily used for the treatment of silver halides, or a bath appropriately buffered with any of the buffering agents enumerated above. In this case also, the effects of the present invention are obtained. The above-described application method may be accomplished, for example, by wiping the surface of the printing plate attached to a printing machine with absorbent cotton impregnated with the lipophilizing solution.

Various other ingredients may be added to the lipophilizing solution for use in the present invention. Examples of such optional ingredients include surface-hydrophilizing agents such as soluble polymers, e.g., hydroxyethyl cellulose, carboxymethyl cellulose, poly(vinyl alcohol), and polyvinylpyrrolidone, and colloidal silica; and colloid hardeners for preventing colloid wear during printing, such as organic colloid hardeners, e.g., formalin, glyoxal, glutar aldehyde, tannic acid, and dimethylolurea, and inorganic hardeners, e.g., chromium and aluminum. Hardening may be conducted with heating for the purpose of enhancing the activity of these hardeners. The lipophilizing solution may further contain any of the higher fatty acids and hydrophobic softeners given in JP-B-45-29001.

In contacting the silver image to the lipophilizing solution for use in the present invention, a contact time of from several seconds to one minute is usually sufficient.

By treating the silver image with the lipophilizing solution containing a compound of the present invention, not only a reduced ink-up time is attained, but also a sufficient ink-receptive ability can be imparted to even an insufficient silver image to improve both print image reproducibility and impression capacity.

The binder for use in each constituent layer of the photosensitive material, the image-receiving material or the complexing agent sheet is preferably a hydrophilic binder. Examples thereof are given in the Research Disclosure references cited hereinabove and JP-A-64-13546, pp. 71–75. Specifically, transparent or translucent hydrophilic binders are preferred. Examples of these binders include natural compounds such as proteins, e.g., gelatin and gelatin derivatives, cellulose derivatives, polysaccharides such as agar, starch, gum arabic, dextran, pullulan, furcellan, the carrageenan described in European Patent Publication 443,529, locust bean gum, xanthane gum, and pectin, and the polysaccharide described in JP-A-1-221736; and synthetic polymers such as poly(vinyl alcohol), the alkyl-modified poly(vinyl alcohol) described in JP-A-7-219113, polyvinylpyrrolidone, and acrylamide polymers. Also usable is the highly water-absorbing polymer described in, e.g., U.S. Pat. No. 4,960,681 and JP-A-62-245260. This water-absorbing polymer is a homopolymer of a vinyl monomer having —COOM or —SO$_3$M (M is a hydrogen atom or an alkali metal), a copolymer of two or more such vinyl monomers, or a copolymer of one or more such vinyl monomers with one or more other vinyl monomers (e.g., sodium methacrylate or ammonium methacrylate) (e.g., Sumikagel L-5H, manufactured by Sumitomo Chemical Co., Ltd.). These binders may be used in combination of two or more thereof. Preferred is a combination of gelatin and the above-described binder. The gelatin may be selected, according to various purposes, from limed gelatin, an acid-treated gelatin, and the so-called delimed gelatin having a reduced content of calcium and the like. A combination of two or more of these may also be preferably used.

In the system of the present invention in which a slight amount of water is fed to conduct heat development, use of the above-described highly water-absorbing polymer not only enables rapid water absorption but also enables the nonimage area to well hold dampening water therein, i.e., to have improved water retention, during printing.

In the case of a low gelatin content, preferably used hydrophilic polymers other than gelatin from the standpoint of setting at coating are the carrageenan described in European Patent Publication 443,529, the alkyl-modified poly (vinyl alcohol) described in JP-A-7-219113, and the polysaccharides given in JP-A-6-67330.

The total binder amount in each of the photosensitive material and the image-receiving material or complexing agent sheet is desirably from 12 to 0.5 g/m², preferably up to 5 g/m², especially preferably up to 3 g/m².

The reducing agent for use in the present invention can be selected from reducing agents known in the field of photosensitive materials. The dye-donating compounds having reducing properties as described later are included in the known reducing agents (such a dye-donating compound may be used in combination with another reducing agent). Also usable is a reducing agent precursor which itself has no reducing properties but comes to have reducing properties during development by the action of a nucleophilic reagent or heat.

Examples of the reducing agent for use in the present invention include the reducing agents and reducing agent precursors given in, e.g., U.S. Pat. Nos. 4,500,626 (columns 49–50), 4,839,272, 4,330,617, 4,590,152, 5,017,454, and 5,139,919, JP-A-60-140335 (pages 17–18), JP-A-57-40245, JP-A-56-138736, JP-A-59-178458, JP-A-59-53831, JP-A-59-182449, JP-A-59-182450, JP-A-60-119555, JP-A-60-128436, JP-A-60-128439, JP-A-60-198540, JP-A-60-181742, JP-A-61-259253, JP-A-62-201434, JP-A-62-244044, JP-A-62-131253, JP-A-62-131256, JP-A-63-10151, JP-A-64-13546 (pages 40–57), JP-A-1-120553, JP-A-2-32338, JP-A-2-35451, JP-A-2-234158, JP-A-3-160443, and European Patent 220,746 (pages 78–96).

Various reducing agent combinations such as those disclosed in U.S. Pat. No. 3,039,869 are also usable.

In the case of using a nondiffusing reducing agent, this reducing agent may be used in combination with an electron-transporting agent and/or a precursor thereof according to need in order to accelerate electron movement between the nondiffusing reducing agent and the developable silver halide. Especially preferred examples thereof are given in U.S. Pat. No. 5,139,919, European Patent Publication 418,743, JP-A-1-138556, and JP-A-3-102345. The technique for stably incorporating such ingredients into a layer as described in JP-A-2-230143 and JP-A-2-235044 is preferably employed.

The electron-transporting agent or precursor thereof can be selected from the reducing agents or precursors thereof enumerated above. The electron-transporting agent or precursor thereof is desirably more apt to move than the nondiffusing reducing agent (electron donor). Especially useful electron-transporting agents are 1-phenyl-3-pyrazolidone, derivatives thereof, and aminophenols.

Any of the reducing agents enumerated above may be employed as the nondiffusing reducing agent (electron donor) for use in combination with an electron-transporting agent, as long as the reducing agent used is substantially immovable in a layer of the photosensitive material. Preferred examples thereof include hydroquinone and derivatives thereof, sulfonamidophenols, sulfonamidonaphthols, and the electron-donating compounds given in JP-A-53-110827 and U.S. Pat. Nos. 5,032,487, 5,026,634, and 4,839,272.

An electron donor precursor such as that given in JP-A-3-160443 is also advantageously used.

Also usable are development inhibitor-releasing reducing compounds such as those given in JP-B-3-63733, JP-A-1-150135, JP-A-2-110557, JP-A-2-64634, JP-A-3-43735, and European Patent Publication 451,833.

The total reducing agent amount in the present invention is desirably from 0.01 to 20 mol, preferably from 0.1 to 10 mol, per mol of silver.

An organometallic salt may be used in the present invention as an oxidizing agent in combination with the photosensitive silver halide emulsion. Especially preferred of such organometallic salts are organosilver salts.

Examples of organic compounds usable for forming such organosilver salt oxidizing agents include the benzotriazole, its derivatives, fatty acids, and other compounds given in U.S. Pat. No. 4,500,626, columns 52–53. Silver acetylide is also useful as described in U.S. Pat. No. 4,775,613. A combination of two or more organosilver salts may be used.

These organosilver salts can be used in an amount of from 0.01 to 10 mol, preferably from 0.01 to 1 mol, per mol of the photosensitive silver halide. The total amount of the photosensitive silver halide emulsion and organosilver salt contained in the photosensitive material is desirably from 0.05 to 10 g/m², preferably from 0.4 to 3 g/m², in terms of silver amount.

A compound which serves not only to accelerate development but to improve image stability can be used in the photosensitive material of the present invention. Preferred examples of this compound are given in U.S. Pat. No. 4,500,626, columns 51–52.

For incorporating hydrophobic additives including a non-diffusing reducing agent into a layer of the photosensitive material, known techniques such as that described in U.S. Pat. No. 2,322,027 can be used. In this case, a high-boiling organic solvent can be used optionally together with a low-boiling organic solvent having a boiling point of from 50° to 160° C. Examples of the high-boiling organic solvent are given in, e.g., U.S. Pat. Nos. 4,555,470, 4,536,466, 4,536,467, 4,587,206, 4,555,476, and 4,599,296, JP-A-63-306439, JP-A-62-8145, JP-A-62-30247, and JP-B-3-62256. These nondiffusing reducing agents, high-boiling organic solvents, and other kinds of additives each may be used in combination of two or more thereof.

The amount of the high-boiling organic solvent is up to 10 g, desirably up to 5 g, preferably from 1 to 0.1 g, per g of the hydrophobic additives used. The amount thereof per g of the binder is desirably up to 1 cc, preferably up to 0.5 cc, especially preferably up to 0.3 cc.

Also usable are the method described in JP-B-51-39853 and JP-A-51-59943 in which hydrophobic additives are dispersed with a polymer and the method described in, e.g., JP-A-62-30242 in which hydrophobic additives are added in the form of a dispersion of fine particles thereof.

In the case of a substantially water-insoluble compound, a usable method other than the above-described techniques is to incorporate the compound by dispersing fine particles thereof into a binder.

Various surfactants can be used for dispersing hydrophobic compounds into a hydrophilic colloid. Examples thereof include the surfactants given in JP-A-59-157636 (pages 37–38) and the *Research Disclosure* references cited hereinabove.

Also usable are the phosphoric ester surfactants given in JP-A-7-56267 and JP-A-7-228589 and German Patent (OLS) 1,932,299A.

A mordant known in the photographic field can be used in the image-receiving material or the complexing agent sheet if desired and necessary. Examples thereof are given in, e.g., U.S. Pat. No. 4,500,626 (columns 58–59), JP-A-61-88256 (pages 32–41), JP-A-1-161236 (pages 4–7), and U.S. Pat. Nos. 4,774,162, 4,619,883, and 4,594,308. Polymers such as those described in U.S. Pat. No. 4,463,079 may also be used.

Auxiliary layers such as, e.g., a subbing layer, interlayer, back layer, and anticurl layer can be formed in the image-receiving material or the complexing agent sheet if desired and necessary. In the complexing agent sheet, a protective layer and a releasing layer also may be provided, and it is particularly useful to provide a protective layer.

Each constituent layer of the photosensitive material and the image-receiving material or complexing agent sheet may contain a plasticizer, a slip agent, or a high-boiling organic solvent as a release agent for facilitating the separation of the photosensitive material from the image-receiving material or the complexing agent sheet. Examples of these ingredients are given in, e.g., the *Research Disclosure* references cited hereinabove and JP-A-62-245253.

For the above purpose, various silicone oils (all silicone oils ranging from dimethyl silicone oil to modified silicone oils obtained by incorporating various organic groups into dimethylsiloxane) can be used. Examples of effective silicone oils include the various modified silicone oils described in *Modified Silicone Oil*, Technical Data P6-18B, published by Shin-Etsu Silicone Co., Ltd., in particular a carboxy-modified silicone (trade name, X-22-3710).

The silicone oils described in JP-A-62-215953 and JP-A-63-46449 are also effective.

Examples of the hardener which may be used in each constituent layer of the photosensitive material and the image-receiving material or complexing agent sheet include the hardeners given in the *Research Disclosure* references cited hereinabove, U.S. Pat. Nos. 4,678,739 (column 41) and 4,791,042, JP-A-59-116655, JP-A-62-245261, JP-A-61-18942, and JP-A-4-218044. Specific examples thereof include aldehyde hardeners (e.g., formaldehyde), aziridine hardeners, epoxy hardeners, vinylsulfone hardeners (e.g., N,N'-ethylenebis(vinylsulfonylacetamide)ethane), N-methylol hardeners (e.g., dimethylolurea), and polymeric hardeners (e.g., compounds given in JP-A-62-234157).

Such a hardener is used in an amount of from 0.001 to 1 g, preferably from 0.005 to 0.5 g, per g of the hydrophilic binder applied. The hardener may be incorporated into any one of the constituent layers of the photosensitive material and the image-receiving material or complexing agent sheet, or may be divided into portions and incorporated into two or more layers.

A nonphotosensitive hydrophilic colloid layer containing a dye, pigment, carbon black, or the like is preferably formed over and/or under the emulsion layer of the photosensitive material of the present invention for the purposes of antihalation, irradiation prevention, etc. A sparingly water-soluble dye or pigment is preferred, which is preferably incorporated into the photosensitive material by dispersing the same in the form of fine solid particles.

Various antifoggants or photograph stabilizers and precursors of both can be used in constituent layers of the photosensitive material and the image-receiving material or complexing agent sheet. Examples thereof are given in, e.g., the *Research Disclosure* references cited hereinabove, U.S. Pat. Nos. 5,089,378, 4,500,627, and 4,614,702, JP-A-64-13546 (pages 7–9, 57–71, and 81–97), U.S. Pat. Nos. 4,775,610, 4,626,500, and 4,983,494, JP-A-62-174747, JP-A-62-239148, JP-A-63-264747, JP-A-1-150135, JP-A-2-110557, JP-A-2-178650, RD-17643 (1978, pages 24–25), and Japanese Patent Application No. 6-190529.

These compounds are used in an amount of desirably from $5 \times 10^{-6}$ to $1 \times 10^{-1}$ mol, preferably from $1 \times 10^{-5}$ to $1 \times 10^{-2}$ mol, per mol of silver.

Various surfactants can be used in constituent layers of the photosensitive material and the image-receiving material or complexing agent sheet as a coating aid or for the purposes of improving releasability or slip properties, prevention of static build-up, acceleration of development, etc. Examples of the surfactants are given in, e.g., the *Research Disclosure* references cited hereinabove, JP-A-62-173463, and JP-A-62-183457.

Organofluorine compounds may be incorporated into constituent layers of the photosensitive material and the image-receiving material or complexing agent sheet for the purposes of improving slip properties, preventing static build-up, improving releasability, etc. Representative examples of the organofluorine compounds include the fluorine compound surfactants given in JP-B-57-9053 (columns 8–17), JP-A-61-20944, and JP-A-62-135826; and hydrophobic fluorine compounds such as fluorine compounds having the consistency of oil, e.g., fluoro-oils, and solid fluororesins such as a tetrafluoroethylene resin.

A matting agent can be used in the photosensitive material and the image-receiving material or complexing agent sheet for the purposes of adhesion prevention, improving slip properties, forming a matte surface, etc. Examples of the matting agent include the matting compounds given in JP-A-61-88256 (page 29), e.g., silicon dioxide, polyolefins, and poly(methyl methacrylate), and the compounds given in JP-A-63-274944 and JP-A-63-274952, e.g., benzoguanamine resin beads, polycarbonate resin beads, and AS resin beads. Other usable matting compounds are given in the *Research Disclosure* references cited hereinabove. These matting agents can be incorporated not only into the uppermost layer (protective layer) but into a lower layer according to need.

These matting agents preferably have an average particle size of from 0.1 to 20 µm. The addition amount of the matting agents is desirably from 1 to 40% by weight, preferably from 2 to 20% by weight, based on the binder amount.

Due to the use of these matting agents, the photosensitive material not only has improved surface slip properties and hence improved handleability, but also can be easily brought into close contact with a contact film or a PS plate with suction.

In this photosensitive material, the matting agent incorporated on the silver halide emulsion layer side (photosensitive layer side) of the support and the matting agent incorporated on the opposite side (back side) thereof may be different from or equal to each other in the particle size and/or incorporation amount thereof.

Fine particles can be incorporated into the image-receiving material of the first aspect or the photosensitive material of the second aspect in the present invention for the purposes of enabling the nonimage area to well hold dampening water, i.e., to have improved water retention, during printing to thereby mitigate print soiling, and of improving the ink-receiving ability of the image area to enhance print image contrast and improve sharpness and improving impression capacity. Examples of the fine particles include titanium oxide, zinc oxide, barium sulfate, silica, clay, talc, and rice starch. The fine particles preferably have a particle diameter of from 1 to 10 µm. Especially preferred are fine silica particles. These finely particulate materials may be used either alone or in combination of two or more thereof. Two or more finely particulate materials may be separately incorporated into different layers. The incorporation amount of the fine particles is desirably from 1 to 40% by weight, preferably from 5 to 25% by weight, based on the binder amount.

A thermal solvent, an antifoaming agent, a bactericide, a mildew-proofing agent, colloidal silica, and the like may be incorporated into constituent layers of the photosensitive material and the image-receiving material or complexing agent sheet. Examples of these additives are given in, e.g., JP-A-61-88256 (pages 26–32), JP-A-3-11338, and JP-B-2-51496.

An image formation accelerator can be used in the photosensitive material and/or the image-receiving material or complexing agent sheet in the present invention. Image formation accelerators are classified by physicochemical functions into bases or base precursors described hereinabove, nucleophilic compounds, high-boiling organic solvents (oils), thermal solvents, surfactants, compounds which interact with silver or silver ions, etc. It is however noted that these kinds of substances each generally has two or more functions and usually combines some of the above acceleration effects. Details of those accelerators are given in U.S. Pat. No. 4,678,739, columns 38–40.

Various development terminators can be used in the photosensitive material and/or the image-receiving material or complexing agent sheet of the present invention for the purpose of obtaining images of always constant quality even when the temperature and time for development fluctuate. The development terminator herein means either a compound which after proper development rapidly neutralizes or reacts with the base to reduce the base concentration in the film and thereby stop the development, or a compound which after proper development interacts with the silver and silver salts to thereby inhibit the development. Examples of the development terminator include an acid precursor which releases an acid upon heating, an electrophilic compound which undergoes a substitution reaction with the coexistent base upon heating, a nitrogen-containing heterocyclic compound, and a mercapto compound and a precursor thereof. Specific examples of such development terminators are given in JP-A-62-253159, pages 31–32.

The support of the photosensitive material and that of the image-receiving material or complexing agent sheet in the present invention are made of a material which withstands the processing temperature. In general, examples thereof include the photographic supports, including papers and synthetic polymers (films), given in Shashin Kogyo No Kiso (Fundamental Photographic Technology, "Gin-en Shashin Hen (a volume of Silver Halide Photography)", edited by Photographic Science and Technology Society of Japan, Corona Publishing Co., Ltd. (1979), pp. 223–240. Specific examples thereof include films of poly(ethylene terephthalate), poly(ethylene naphthalate), a polycarbonate, poly(vinyl chloride), polystyrene, polypropylene, a polyimide, a polyarylate, and a cellulose derivative (e.g., triacetyl cellulose), films of these polymers containing a pigment such as, e.g., titanium oxide, synthetic papers made from polypropylene or the like by the film process, papers made from a mixture of a pulp of a synthetic resin, e.g., polyethylene, and a natural pulp, Yankee paper, baryta paper, coated papers (in particular cast-coated papers), metals, cloths, and glasses.

These supports may be used alone or as a support laminated on one or both sides with a synthetic polymer, e.g., polyethylene. This laminate layer may contain a pigment, e.g., titanium oxide, ultramarine, or carbon black, or a dye according to need.

Other usable supports are described in, e.g., JP-A-62-253159 (pages 29–31), JP-A-1-161236 (pages 14–17), JP-A-63-316848, JP-A-2-22651, JP-A-3-56955, and U.S. Pat. No. 5,001,033.

These supports may be coated on the back side with an antistatic agent, e.g., a semiconducting metal oxide, such as alumina sol or tin oxide, or carbon black, together with a hydrophilic binder. Usable examples of this type of support are given in, e.g., JP-A-63-220246.

The support is desirably designed to have a surface resistivity of $10^{12}$ Ω-cm or lower.

The support is preferably subjected to any of various surface treatments and subbing for the purpose of improving the adhesion of a hydrophilic binder to the support surface.

Examples of methods for recording an image on the photosensitive material through exposure include a method in which a landscape, a man, etc. is directly photographed with a camera; a method in which the photosensitive material is exposed through a reversal or negative film using a printer, an enlarger, or the like; a method in which the photosensitive material is exposed while scanning an original through a slit or the like using, e.g., the exposure device of a copier; a method in which image information is converted to electrical signals, with which a light-emitting diode, any of various lasers (e.g., laser diodes and gas lasers), or the like is operated to scan-wise expose the photosensitive material (the method described in, e.g., JP-A-2-129625, JP-A-5-176114, JP-A-5-199872, and JP-A-6-127021); and a method in which image information is outputted to an image display device, e.g., a CRT, liquid-crystal display, electroluminescent display, or plasma display, to expose the photosensitive material directly or through an optical system. It is preferred to conduct the exposure using a combination of mirrors or the like for preventing the resulting print from bearing a mirror image.

Examples of light sources usable for recording an image on the photosensitive material include, as mentioned above, natural light, a tungsten lamp, a light-emitting diode, a laser, and a CRT. These light sources and usable exposure methods are described in U.S. Pat. No. 4,500,626 (column 56), JP-A-2-53378, and JP-A-2-54672.

Specific examples of usable exposure devices include commercial Ar laser exposure devices, e.g., DC Series manufactured by Linotype-Hell Co. and Magnascan Series manufactured by Crosfield Co.; commercial He—Ne laser exposure devices, e.g., SG Series manufactured by Dainippon Screen Mfg. Co., Ltd.; commercial semiconductor laser exposure devices, e.g., Lux Scan manufactured by Fuji Photo Film Co., Ltd.; color scanners, e.g., MTR manufactured by Dainippon Screen Mfg. Co., Ltd.; image setters, e.g., Selectset (He—Ne) and Avantra (Red-LD) manufactured by Agfa-Gevaert Co., Herkules (Red-LD) manufactured by Linotype-Hell Co., Dolev (He—Ne) manufactured by Scitex Co., Accuset (Red-LD) manufactured by Agfa-Gevaert Co., and Lux Setter 5600 manufactured by Fuji Photo Film Co., Ltd.; and facsimile exposure devices, e.g., 240R manufactured by NEC Corp.

It is possible to use a light source comprising a combination of a blue light-emitting diode, which has showed marked progress recently, with a green light-emitting diode and a red light-emitting diode. Especially preferred are the exposure devices described in Japanese Patent Applications Nos. 6-40164, 6-40012, 6-42732, 6-86919, 6-93421, 6-94820, 6-96628, and 6-149609.

Further, a wavelength-changing device comprising a combination of a nonlinear optical material and a source of a coherent light, e.g., a laser beam, can be used for image-wise exposure. The nonlinear optical material herein means a material which, when an electric field is applied thereto by means of an intense light, e.g., a laser beam, is capable of exhibiting a nonlinear optical effect between the resulting polarization and the electric field. Preferred nonlinear optical materials include inorganic compounds represented by lithium niobate, potassium dihydrogen phosphate (KDP), lithium iodate, and $BaB_2O_4$, urea derivatives, nitroaniline derivatives, nitropyridine N-oxide derivatives such as 3-methyl-4-nitropyridine N-oxide (POM), and the nonlinear compounds given in JP-A-61-53462 and JP-A-62-210432. The type of the wavelength-changing device can be selected from the monocrystal optical waveguide type, the fiber type, and the like, which each is known and useful.

The image information can be image signals obtained from a video camera, electronic still camera, etc., TV signals represented by the signals in accordance with Nippon Television Signal Standards (NTCS), image signals obtained from many picture elements obtained by partitioning an original by means of a scanner or the like, or image signals produced by a computer represented by a CG or CAD.

The photosensitive material and/or the complexing agent sheet of the present invention may have an electrically conductive heater layer as a heating means for heat development and silver salt diffusion transfer. In this case, the heating element described in, e.g., JP-A-61-145544 can be utilized.

In the present invention, heat development is conducted in the presence of a small amount of water, preferably at a heating temperature of from 50° to 100° C.

Any of the ordinarily used waters may be employed in the present invention. Examples thereof include distilled water, tap water, well water, and mineral water. In a heat development apparatus in which the photosensitive material and the image-receiving material or complexing agent sheet of the present invention are used, the water may be used up or may be circulated for repeated use. In the latter case, the circulated water to be used contains ingredients which have come thereinto from those materials. The apparatus and water given in, e.g., JP-A-63-144354, JP-A-63-144355, JP-A-62-38460, and JP-A-3-210555 may also be used. The water may contain a water-soluble low-boiling solvent, surfactant, antifoggant, complex-forming compound, mildew-proofing agent, and bactericide.

Although the water can be fed to either the photosensitive material or the image-receiving material (or complexing agent sheet), it is preferred to fed the same to the photosensitive material. The use amount thereof may be up to the weight corresponding to the maximum volume increase by swelling of all the coating films.

Preferably used for feeding the water is the methods described in, e.g., JP-A-62-253159 (page 5) and JP-A-63-85544. It is also possible to microencapsulate the water or to incorporate water in the form of a hydrate beforehand into either the photosensitive material or the image-receiving material (or complexing agent sheet).

The temperature of the water fed may be from 30° to 60° C. as described in JP-A-63-85544, mentioned above. A water temperature of 45° C. or higher is effective especially in preventing the growth of various bacteria in the water.

A hydrophilic thermal solvent which is solid at ordinary temperature and liquid at high temperatures can be incorporated into the photosensitive material and/or the image-receiving material or complexing agent sheet. Specifically, that solvent can be incorporated into the photosensitive silver halide emulsion layer, interlayer, protective layer, or antihalation layer of the photosensitive material, and into any layer of the image-receiving material or complexing agent sheet. Examples of the hydrophilic thermal solvent include urea and derivatives thereof, pyridine and derivatives thereof, amides, sulfonamides, imides, alcohols, oximes, and other heterocyclic compounds.

Heating during the development and/or transfer step may be accomplished, for example, by contacting to a heated block or plate, by contacting to a hot plate, hot presser, heated roller, heated drum, halogen lamp heater, infrared or far-infrared heater, or the like, or by passing through a high-temperature atmosphere.

For superposing the photosensitive material on the image-receiving material or complexing agent sheet, the techniques described in JP-A-62-253159 and JP-A-61-147244 (page 27) can be used.

For processing the photographic element of the present invention, any of various thermal development apparatus can be used. Preferred examples thereof include the apparatus described in JP-A-59-75247, JP-A-59-177547, JP-A-59-181353, JP-A-60-18951, JP-A-U-62-25944 (the term "JP-A-U" as used herein means an "unexamined published Japanese utility model application"), and Japanese Patent Applications Nos. 4-277517, 4-243072, and 4-244693. Examples of usable commercial apparatus include Pictrostat 100, Pictrostat 200, Pictrostat 300, Pictrography 3000, and Pictrography 2000, all manufactured by Fuji Photo Film Co., Ltd.

The speed at which a film is transferred through these heat development apparatus (linear speed) may be high or low. In the case of using a miniaturized apparatus, a linear speed of, e.g., 200 mm/min or lower may be used. For processing a large quality of film in a short time period, use may be made of a linear speed of, e.g., 1,000 mm/min or above, or a high linear speed of 1,500 mm/min or above. It is a matter of course that any linear speed between these may be used according to purposes.

The present invention will be explained below by reference to Examples, but the invention should not be construed as being limited thereto.

EXAMPLE 1

A polyester film support which had been primed on both sides was coated on one side with a back layer comprising a dispersion of carbon black and a matting agent with an average particle diameter of 5.5 μm in poly(vinyl chloride), thereby giving an optical density of 1.0. The opposite side of the support was coated with the layers shown in Table 1 given below to obtain a photosensitive material.

TABLE 1

Constitution of Photosensitive Material

| Layer number | Layer name | Ingredient | Amount (mg/m$^2$) |
|---|---|---|---|
| Fifth layer | Protective layer II | Acid-treated gelatin | 252 |
| | | PMMA latex (size, 3 μm) | 12 |
| | | Surfactant (4) | 2 |
| | | Surfactant (1) | 18 |
| | | Sumikagel L5-H (manufactured by Sumitomo Chemical Co., Ltd.) | 130 |
| Fourth layer | Protective layer I | Limed gelatin | 344 |
| | | Zinc hydroxide | 600 |

TABLE 1-continued

| | | | |
|---|---|---|---|
| | | Surfactant (1) | 5 |
| | | Dextran | 16 |
| | | Water-soluble polymer (1) | 6 |
| | | Surfactant (2) | 25 |
| Third layer | Emulsion layer | Photosensitive silver halide emulsion (I) silver amount | 1,420 |
| | | Limed gelatin | 660 |
| | | Sensitizing dye (1) | 4 |
| | | Surfactant (3) | 32 |
| | | Water-soluble polymer (1) | 36 |
| Second layer | Interlayer | Limed gelatin | 950 |
| | | 1,5-Diphenyl-3-pyrazolidone | 1,650 |
| | | Dextran | 86 |
| | | Hardener (1) | 24 |
| | | Surfactant (1) | 16 |
| | | Surfactant (2) | 80 |
| | | Water-soluble polymer (1) | 22 |
| First layer | AH layer | Zinc thiosalicylate | 300 |
| | | Limed gelatin | 540 |
| | | Surfactant (1) | 3 |
| | | Surfactant (2) | 15 |
| | | Water-soluble polymer (1) | 36 |

Support: poly(ethylene terephthalate) [primed with gelatin; thickness, 100 μm]

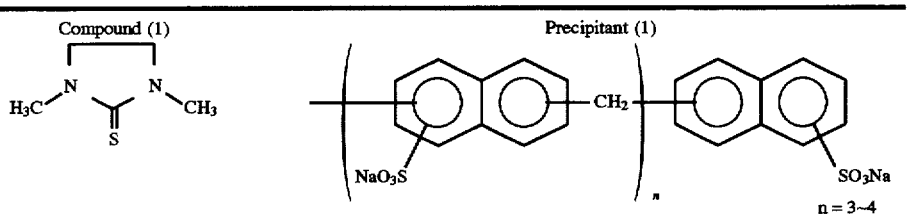

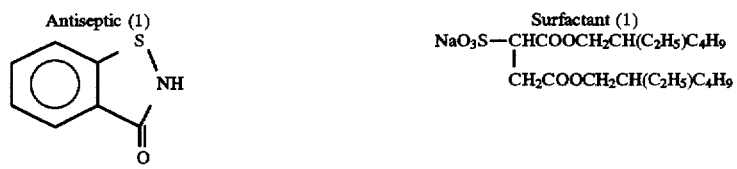

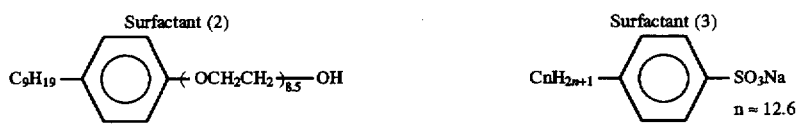

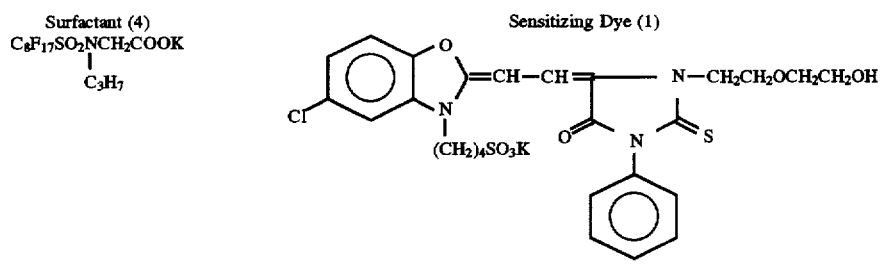

The emulsion shown in Table 1 was prepared by the following method.

In 650 cc of water were dissolved 20 g of gelatin and 3 g of sodium chloride at 40° C. with stirring. After completion of the dissolution, 15 cc of 0.1% methanol solution of compound (1) was added. To this solution was added, with stirring at a constant temperature of 40° C., a silver nitrate solution (obtained by adding water to 50 g of AgNO₃ to a total volume of 300 cc) over a period of 5 minutes. A halogen solution (obtained by adding water to a mixture of 17 g of NaCl, 1.75 g of KBr, and $4 \times 10^{-2}$ mg of $(NH_4)_3RhCl_6$ to a total volume of 300 cc) began to be added at 5 seconds after initiation of the addition of the silver nitrate solution, and was added over a period of 4 minutes and 55 seconds. A 300 cc quantity of aqueous silver nitrate solution having the same concentration as the above and a halogen solution (obtained by adding water to a mixture of 17 g of NaCl, 1.75 g of KBr, and 0.3 mg of $K_3IrCl_6$ to a total volume of 300 cc) began to be simultaneously added at 2 minutes after completion of the above addition, and simultaneously added over a period of 5 minutes.

After completion of the addition, the reaction mixture was maintained at 40° C. for 20 minutes, and 680 cc of water was then added. Further, 15 cc of 1N sulfuric acid and 15 cc of a 1% aqueous solution of precipitant (1) were added. The resulting mixture had a pH of about 4.0. After precipitation of silver halide grains, 2,200 cc of the supernatant was removed for salt removal. To the remainder was added 2,000 cc of water. Subsequently, 2,200 cc of the supernatant was removed in the same manner. To this liquid were added 22 g of gelatin, 2 cc of 1N NaOH, and 4 cc of a 10% aqueous NaCl solution. To this mixture was added 70 mg of antiseptic (1). Thus, a silver chlorobromide emulsion (Br, 5 mol %) was obtained. This silver chlorobromide emulsion had a pH of 6.0, and the yield thereof was about 600 g.

A dispersion of 1,5-diphenyl-3-pyrazolidone as a reducing agent was prepared by the following method.

To 90 ml of a 3% aqueous solution of limed gelatin were added 10 g of 1,5-diphenyl-3-pyrazolidone, 0.1 g of surfactant (1), and 0.5 g of surfactant (2). This mixture was subjected to a 30-minute dispersion treatment with glass beads having an average particle diameter of 0.75 mm. The glass beads were removed to obtain a gelatin dispersion of the reducing agent.

A gelatin dispersion of zinc hydroxide was prepared in the same manner as the above.

Subsequently, an image-receiving material having the constitution shown in Table 2 was produced. The palladium sulfide was prepared by the method described in JP-B-48-16725.

TABLE 2

| Layer number | Ingredient | amount (mg/m²) |
|---|---|---|
| Fourth layer | Palladium sulfide | 2 |
| | Limed gelatin | 1.5 |
| Third layer | Gelatin | 250 |
| | Sumikagel L5-H | 10 |
| | Surfactant (5) | 27 |
| | Hardener (2) | 48 |
| | Silica (average particle diameter, 3 μm) | 50 |
| Second layer | Gelatin | 800 |
| | Sumikagel L5-H | 240 |
| | Dextran | 660 |
| | Polymer dispersion (Nipol LX814, manufactured by Nippon Zeon Co., Ltd.) | 600 |
| | Polymer (2) | 2,400 |
| | Surfactant (3) | 10 |
| | Guanidine picolinate | 2,800 |
| | Hydantoin | 550 |
| | Silica (average particle diameter, 3 μm) | 160 |
| First layer | Gelatin | 150 |
| | Sumikagel L5-H | 40 |
| | Surfactant (3) | 6 |
| | Surfactant (5) | 27 |
| | Silica (average particle diameter, 7 μm) | 30 |

TABLE 2-continued

| Support | Poly(ethylene terephthalate) film support (thickness, 200 μm) |
|---|---|

Surfactant (5)

$$C_{11}H_{23}CONHCH_2CH_2CH_2\overset{+}{N}(CH_3)_2CH_2COO^-$$

Hardener (2)

$$CH_2CH{-}CH_2O(CH_2)_4OCH_2{-}CHCH_2$$
$$\underset{O}{\diagdown\diagup} \qquad \underset{O}{\diagdown\diagup}$$

Polymer (2)

$$-(CH_2CH)_{70}-(CH_2CH)_{30}-$$

The photosensitive material thus obtained was image-wise exposed, subsequently immersed for 2.5 seconds in water heated at 40° C., squeezed with a roller, and immediately superposed on the image-receiving material so that the coating side of the photosensitive material was in contact with the coating side of the image-receiving material. The superposed materials were then heated for 20 seconds with a heat drum regulated so that the surface of the water-impregnated coating was heated to 75° C. The photosensitive material was then peeled off.

The thus-obtained image-receiving material was attached as a printing plate, without performing any treatment, to printing machine Hamada 611XLA-II. After dampening with water, printing was performed. As a result, 750 or more prints were obtained.

Subsequently, the image-receiving material which had undergone the above-described processing was immersed for 20 seconds at 25° C. in lipophilizing solution 101 having the composition shown in Table 3, squeezed, and then dried to obtained printing plate 101.

TABLE 3

| Lipophilizing solution | 101 | 102 | 103 | 104 |
|---|---|---|---|---|
| Isopropyl alcohol | 250 ml | 250 ml | 250 ml | 250 ml |
| Ethylene glycol monomethyl ether | 40 ml | 40 ml | 40 ml | 40 ml |
| Potassium citrate | 32 g | 32 g | 32 g | 32 g |
| Oleic acid | 25 ml | 25 ml | 25 ml | 25 ml |
| Sodium nitrite | 5 g | 5 g | 5 g | 5 g |
| Potassium ferricyanide(III) | — | 65 g | 65 g | 65 g |
| Compound of the present invention (58-2) | — | 1.0 g | — | — |
| Compound of the present invention (64-3) | — | — | 1.0 g | — |
| Compound of the present invention (13) | — | — | — | 1.0 g |
| Water | up to 1000 ml | up to 1000 ml | up to 1000 ml | up to 1000 ml |

This printing plate 101 was attached to the same printing machine as the above. After dampening with water, printing was performed. As a result, 1,000 or more prints were obtained.

The image-receiving material which had undergone the above-described processing was immersed for 20 seconds at 25° C. in each of lipophilizing solutions 102 to 104 shown in Table 3, squeezed, and dried to obtain printing plates 102 to 104. Each of these printing plates was attached to the same printing machine as the above. After dampening with water, printing was performed. The results obtained are shown in Table 4.

TABLE 4

| Printing plate | Ink-up (sheets) | Impression capacity (sheets) |
|---|---|---|
| 102 | 9 | 5,800 |
| 103 | 12 | 4,400 |
| 104 | 15 | 4,900 |

In Table 4, the term "ink-up" means the number of prints obtained, after the dampening of the plate surface with water, during the period of from initiation of the ordinary printing operation including the steps of contacting the plate surface with an ink roller and with a water roller to the time when the ink density in the image area reaches a sufficient equilibrium. The term "impression capacity" means the number of prints obtained which bear a 10% half tone image area with a line density of 175 per inch.

The above results show that satisfactory printing plates were obtained by the process of the present invention.

EXAMPLE 2

A polyester film support which had been primed on both sides was coated on one side with a back layer comprising a dispersion of carbon black and a matting agent with an average particle diameter of 5.5 μm in poly(vinyl chloride), thereby giving an optical density of 1.0. The opposite side of the support was coated with the layers shown in Table 5 given below to obtain a silver halide photosensitive material.

TABLE 5

| Constitution of Silver Halide Photosensitive Material | | | |
|---|---|---|---|
| Layer number | Layer name | Ingredient | Amount (mg/m$^2$) |
| Fourth layer | Physical-development nucleus layer | Palladium sulfide | 2 |
| | | Limed gelatin | 1.5 |
| Third layer | Emulsion layer | Photosensitive silver halide emulsion (I) silver amount | 1,420 |
| | | Limed gelatin | 660 |
| | | Sensitizing dye (1) | 4 |
| | | Surfactant (3) | 32 |
| | | Water-soluble polymer (1) | 36 |
| | | Silica (average particle diameter, 3 μm) | 35 |
| Second layer | Interlayer | Limed gelatin | 344 |
| | | Zinc hydroxide | 600 |
| | | Surfactant (1) | 5 |
| | | Dextran | 16 |
| | | Water-soluble polymer (1) | 6 |
| | | Surfactant (2) | 25 |
| | | Silica (average particle diameter, 3 μm) | 70 |
| First layer | Reducing agent layer | Limed gelatin | 950 |
| | | 1,5-Diphenyl-3-pyrrolidone | 1,650 |
| | | Dextran | 86 |
| | | Hardener (1) | 24 |
| | | Surfactant (1) | 16 |
| | | Surfactant (2) | 80 |
| | | Water-soluble polymer (1) | 22 |
| | | Silica (average particle diameter, 7 μm) | 190 |

TABLE 5-continued

| Constitution of Silver Halide Photosensitive Material | | | |
|---|---|---|---|
| Layer number | Layer name | Ingredient | Amount (mg/m$^2$) |
| | | Zinc thiosalicylate | 300 |
| Support: poly(ethylene terephthalate) [primed with gelatin; thickness, 200 μm] | | | |

The emulsion shown in Table 5 was prepared by the following method.

In 650 cc of water were dissolved 20 g of gelatin and 3 g of sodium chloride at 40° C. with stirring. After completion of the dissolution, 15 cc of 0.1% methanol solution of compound (1) was added. To this solution was added, with stirring at a constant temperature of 40° C., a silver nitrate solution (obtained by adding water to 50 g of AgNO$_3$ to a total volume of 300 cc) over a period of 5 minutes. A halogen solution (obtained by adding water to a mixture of 16 g of NaCl, 10.5 g of KBr, and 4×10$^{-2}$ mg of (NH$_4$)$_3$RhCl$_6$ to a total volume of 300 cc) began to be added at 5 seconds after initiation of the addition of the silver nitrate solution, and was added over a period of 4 minutes and 55 seconds. A 300 cc quantity of aqueous silver nitrate solution having the same concentration as the above and a halogen solution (obtained by adding water to a mixture of 16 g of NaCl, 10.05 g of KBr, and 0.3 mg of K$_3$IrCl$_6$ to a total volume of 300 cc) began to be simultaneously added at 2 minutes after completion of the above addition, and simultaneously added over a period of 5 minutes.

After completion of the addition, the reaction mixture was maintained at 40° C. for 20 minutes, and 680 cc of water was then added. Further, 15 cc of 1N sulfuric acid and 15 cc of a 1% aqueous solution of precipitant (1) were added. The resulting mixture had a pH of about 4.0. After precipitation of silver halide grains, 2,200 cc of the supernatant was removed for salt removal. To the remainder was added 2,000 cc of water. Subsequently, 2,200 cc of the supernatant was removed in the same manner. To this liquid were added 22 g of gelatin, 2 cc of 1N NaOH, and 4 cc of a 10% aqueous NaCl solution. To this mixture was added 70 mg of antiseptic (1). Thus, a silver chlorobromide emulsion (Br, 30 mol %) was obtained. This silver chlorobromide emulsion had a pH of 6.0, and the yield thereof was about 600 g.

A dispersion of 1,5-diphenyl-3-pyrazolidone as a reducing agent was prepared by the following method.

To 90 ml of a 3% aqueous solution of limed gelatin were added 10 g of 1,5-diphenyl-3-pyrazolidone, 0.1 g of surfactant (1), and 0.5 g of surfactant (2). This mixture was subjected to a 30-minute dispersion treatment with glass beads having an average particle diameter of 0.75 mm. The glass beads were removed to obtain a gelatin dispersion of the reducing agent.

A gelatin dispersion of zinc hydroxide was prepared in the same manner as the above. Further, the palladium sulfide used in the physical-development nucleus layer was prepared in accordance with the method described in JP-B-48-16725.

Subsequently, a complexing agent sheet having the constitution shown in Table 6 was produced.

TABLE 6

Constitution of Complexing Agent Sheet

| Layer number | Ingredient | amount (mg/m²) |
|---|---|---|
| Third layer | Gelatin | 250 |
| | Sumikagel L5-H | 10 |
| | Surfactant (5) | 27 |
| | Hardener (2) | 48 |
| Second layer | Gelatin | 800 |
| | Sumikagel L5-H | 240 |
| | Dextran | 660 |
| | Polymer dispersion (Nipol LX814, manufactured by Nippon Zeon Co., Ltd.) | 600 |
| | Polymer (2) | 2,400 |
| | Surfactant (3) | 10 |
| | Guanidine picolinate | 2,800 |
| | Hydantoin | 520 |
| First layer | Gelatin | 150 |
| | Sumikagel L5-H | 40 |
| | Surfactant (3) | 6 |
| | Surfactant (5) | 27 |
| Support | Poly(ethylene terephthalate) film support (thickness, 120 μm) | |

The silver halide photosensitive material thus obtained was image-wise exposed, subsequently immersed for 2.5 seconds in water heated at 40° C., squeezed with a roller, and immediately superposed on the complexing agent sheet so that the coating side of the photosensitive material was in contact with the coating side of the complexing agent sheet. The superposed materials were then heated for 20 seconds with a heat drum regulated so that the surface of the water-impregnated coating was heated to 75° C. The photosensitive material was then peeled off.

The thus-obtained photosensitive material as an image-receiving material was attached as a printing plate, without performing any treatment, to printing machine Hamada 611XLA-II. After dampening with water, printing was performed. As a result, 800 or more prints were obtained.

Subsequently, the photosensitive material which had undergone the above-described processing was immersed for 30 seconds at 25° C. in lipophilizing solution 201 having the composition shown in Table 7, squeezed, and then dried to obtained printing plate 201.

TABLE 7

| Lipophilizing solution | 201 | 202 | 203 | 204 |
|---|---|---|---|---|
| Isopropyl alcohol | 250 ml | 250 ml | 250 ml | 250 ml |
| Ethylene glycol monomethyl ether | 40 ml | 40 ml | 40 ml | 40 ml |
| Potassium citrate | 30 g | 30 g | 30 g | 30 g |
| Potassium thiocyanate | 15 g | 15 g | 15 g | 15 g |
| Compound of the present invention (57-1) | — | 1.0 g | — | — |
| Compound of the present invention (60-7) | — | — | 1.0 g | — |
| Compound of the present invention (38) | — | — | — | 1.0 g |
| Water | up to 1000 ml | up to 1000 ml | up to 1000 ml | up to 1000 ml |

This printing plate 201 was attached to the same printing machine as the above. After dampening with water, printing was performed. As a result, 1,000 or more prints were obtained.

The photosensitive material which had undergone the above-described processing was immersed for 30 seconds at 25° C. in each of lipophilizing solutions 202 to 204 shown in Table 7, squeezed, and dried to obtain printing plates 202 to 204. Each of these printing plates was attached to the same printing machine as the above. After dampening with water, printing was performed. The results obtained are shown in Table 8.

TABLE 8

| Printing plate | Ink-up (sheets) | Impression capacity (sheets) |
|---|---|---|
| 202 | 11 | 6,600 |
| 203 | 14 | 5,900 |
| 204 | 16 | 5,500 |

In Table 8, the terms "ink-up" and "impression capacity" each have the same meanings as in Example 1.

The above results show that satisfactory printing plates were obtained by the process of the present invention.

While the invention has been described in detail and with reference to specific embodiments thereof, it will be apparent to one skilled in the art that various changes and modifications can be made therein without departing from the spirit and scope thereof.

What is claimed is:

1. A process for producing a lithographic printing plate which comprises:

image-wise exposing a silver halide photosensitive material comprising a support having thereon at least a photosensitive silver halide, a binder, and a substantially water-insoluble basic metal compound and having a physical-development nucleus layer on the external surface thereof;

superposing the silver halide photosensitive material either after or simultaneously with the image-wise exposure on a sheet which contains a complex-forming compound capable of forming a complex with the metal ion contained in the basic metal compound and a silver halide solvent, in such a manner that the coating side of the photosensitive material is in contact with the coating side of the sheet;

heating the superposed materials in the presence of a reducing agent and water;

subsequently separating the sheet from the photosensitive material to form a silver image on the physical-development nucleus layer by means of silver salt diffusion transfer; and utilizing the silver image as an ink-receptive area.

2. The process for producing a lithographic printing plate as claimed in claim 1, wherein the silver image obtained on the silver halide photosensitive material is lipophilized by contacting the silver image with a liquid containing an organic compound having an —SH or >C=S group.

* * * * *